United States Patent
Ando et al.

(10) Patent No.: US 11,157,797 B2
(45) Date of Patent: Oct. 26, 2021

(54) EVALUATING QUALITY OF A PRODUCT SUCH AS A SEMICONDUCTOR SUBSTRATE

(71) Applicant: OMRON Corporation, Kyoto (JP)

(72) Inventors: Tanichi Ando, Komaki (JP); Hiroshi Sugahara, Kyoto (JP)

(73) Assignee: OMRON Corporation, Kyoto (JP)

( * ) Notice: Subject to any disclaimer, the term of this patent is extended or adjusted under 35 U.S.C. 154(b) by 249 days.

(21) Appl. No.: 16/348,928

(22) PCT Filed: Feb. 17, 2017

(86) PCT No.: PCT/IB2017/000125
§ 371 (c)(1),
(2) Date: May 10, 2019

(87) PCT Pub. No.: WO2018/150210
PCT Pub. Date: Aug. 23, 2018

(65) Prior Publication Data
US 2019/0362221 A1    Nov. 28, 2019

(51) Int. Cl.
*G06K 9/00* (2006.01)
*G06N 3/04* (2006.01)
(Continued)

(52) U.S. Cl.
CPC ....... *G06N 3/0472* (2013.01); *G01N 21/9501* (2013.01); *G06N 3/084* (2013.01);
(Continued)

(58) Field of Classification Search
CPC .. G06N 3/0472; G06N 3/084; G01N 21/9501; G06T 7/0004; G06T 2207/20081;
(Continued)

(56) References Cited

U.S. PATENT DOCUMENTS 5,751,910 A * 5/1998 Bryant ................ G06N 3/0436
                                                        706/2
6,641,746 B2 * 11/2003 Houge .............. H01J 37/32935
                                                       156/345.24
(Continued)

FOREIGN PATENT DOCUMENTS

| JP | H05-225163 A | 9/1993 |
| JP | H09-120455 A | 5/1997 |
| JP | 2008-164461 A | 7/2008 |

OTHER PUBLICATIONS

Okatani, "Deep Learning and Image Recognition,—Basics and Current Trends—" Communications of the Operations Research Society of Japan, Apr. 1, 2015, pp. 198-204, vol. 60, No. 4, The Operations Research Society of Japan; concise explanation of relevance provided in the specification.
(Continued)

*Primary Examiner* — Tom Y Lu
(74) *Attorney, Agent, or Firm* — Metrolex IP Law Group, PLLC

(57) ABSTRACT

An evaluation device may include: a receiving unit that receives an image of the semiconductor substrate, the image captured by an imaging device provided on the semiconductor substrate manufacturing apparatus; a determination unit that determines, using a neural network, at least one value representative of a probability of a machine learning device outputting an erroneous output for the image, the machine learning device configured to: (i) receive the image of the semiconductor substrate, (ii) perform computation using the received image, and (iii) output information indicating the quality of the semiconductor substrate based on a result of the computation; and an output unit that outputs an output based on the at least one value representative of the probability. The neural network has been trained using: images of manufactured semiconductor substrates; and
(Continued)

information indicating, for each one of the images, a level of erroneousness for an output from the machine learning device.

16 Claims, 12 Drawing Sheets

(51) Int. Cl.
*G01N 21/95* (2006.01)
*G06N 3/08* (2006.01)
*G06T 7/00* (2017.01)
*H01L 21/67* (2006.01)

(52) U.S. Cl.
CPC ...... *G06T 7/0004* (2013.01); *H01L 21/67288* (2013.01); *G06T 2207/20081* (2013.01); *G06T 2207/20084* (2013.01); *G06T 2207/30148* (2013.01)

(58) Field of Classification Search
CPC . G06T 2207/20084; G06T 2207/30148; H01L 21/67288; G06K 9/4628; G06K 9/6264; G06K 9/6271; G06K 9/036
See application file for complete search history.

(56) References Cited

U.S. PATENT DOCUMENTS 8,639,489 B2 * 1/2014 Pannese ........... G05B 19/41885
703/17
10,086,511 B2 * 10/2018 van der Meulen ......................
H01L 21/67757

OTHER PUBLICATIONS

Anonymus, "Convolutional neural network", Wikipedia (URL: https://en.wikipedia.org/wiki/Convolutional_neural_network); concise explanation of relevance provided in the specification.
Matjaz Kukar et al., "Reliable Classifications with Machine Learning", In: "Network and Parallel Computing", Jan. 1, 2002, pp. 219-231, vol. 2430, Springer International Publishing; relevance is indicated in the (translated) ISR/WO mailed on Oct. 19, 2017.
Hsieh K-L et al., "Optimization of multiple quality responses involving qualitative and quantitative characteristics in IC manufacturing using neural networks", A Computers in INDU, Aug. 1, 2001, pp. 1-12, vol. 46, No. 1, Elsevier, Amsterdam, NL; relevance is indicated in the (translated)ISR/WO mailed on Oct. 19, 2017.
The International Search Report("ISR") of PCT/IB2017/000125 dated Oct. 19, 2017.
The Written Opinion("WO") of PCT/IB2017/000125 dated Oct. 19, 2017.

* cited by examiner

EVALUATING QUALITY OF A PRODUCT SUCH AS A SEMICONDUCTOR SUBSTRATE

The application relates to evaluating quality of a product such as a semiconductor substrate manufactured by a semiconductor substrate manufacturing apparatus.

BACKGROUND

Methods and/or systems for evaluating quality of manufactured products using artificial intelligence (AI) have been developed. For example, JP 2008-164461A discloses an inspection method of a thin-plate shaped component, where images of two surfaces of a thin-shaped component are captured, input values to a neural network are calculated from image data using two dimensional fast Fourier transform and the quality of the thin-plate shaped component is determined by inputting the calculated input values into the neural network.

However, determination made by AI might not always be correct. In this respect, JP H05-225163A discloses a neural network system that includes a problem solving neural network and an evaluation network, the evaluation network being trained to output an output node value depending on whether arbitrary input data values are learnt data used for training the problem solving neural network or are unlearnt data different from the learnt data. The output node value from the evaluation network may be considered as indicating certainty of an output from the problem solving neural network for the arbitrary input data values.

In some circumstances, further improvements on more accurate evaluation on outputs of AI used for evaluating quality of manufactured products are desirable in order to improve overall quality of manufactured products.

SUMMARY

According to one aspect, an evaluation device is provided for evaluating quality of a semiconductor substrate manufactured by a semiconductor substrate manufacturing apparatus. The evaluation device may comprise the following:
  a receiving unit configured to receive an image of the semiconductor substrate, the image being captured by an imaging device provided on the semiconductor substrate manufacturing apparatus;
  a determination unit configured to determine, using a neural network, at least one value representative of a probability of a machine learning device outputting an erroneous output for the image of the semiconductor substrate, the machine learning device being configured to: (i) receive the image of the semiconductor substrate, (ii) perform computation using the received image, and (iii) output information indicating the quality of the semiconductor substrate based on a result of the computation; and
  an output unit configured to output an output based on the at least one value representative of the probability,
  wherein the neural network has been trained using:
    images of manufactured semiconductor substrates; and
    information indicating, for each one of the images of the manufactured semiconductor substrates, a level of erroneousness for an output from the machine learning device for said one of the images of the manufactured semiconductor substrates.

In some circumstances, the evaluation device according to various aspects of the present disclosure may contribute to improving accuracy of evaluation of the quality of the semiconductor substrate by providing an output based on the at least one value representative of the probability of the machine learning device outputting an erroneous output for the image of the semiconductor substrate. In other words, in some circumstances, the evaluation device according to various aspects of the present disclosure may provide information indicating how reliable an output from the machine learning device is for a particular image of a semiconductor substrate, which may lead to improved accuracy of evaluation of the quality of the semiconductor substrate.

The images used for training the neural network may include one or more images that are not included in training data used for training the machine learning device.

In some examples, the machine learning device may be configured to further receive sensor information from one or more sensors provided in relation to the semiconductor substrate manufacturing apparatus and to perform the computation further using the sensor information. The one or more sensors may be one or more of the following: a temperature sensor; a humidity sensor; a brightness sensor; an atmospheric pressure sensor. The neural network may have been trained further using the sensor information, and the determination made by the determination unit may be based at least partially on the sensor information.

In some other examples, the neural network may have been trained further using sensor information from one or more sensors provided in relation to the semiconductor substrate manufacturing apparatus. The one or more sensors may be one or more of the following: a temperature sensor; a humidity sensor; a brightness sensor; an atmospheric pressure sensor. The determination made by the determination unit may be based at least partially on the sensor information.

Regarding the above stated aspect and examples, the evaluation device may further comprise:
  a neural network training unit configured to train the neural network using the images of the manufactured semiconductor substrates and the information indicating a level of erroneousness for an output from the machine learning device for each of the images of the manufactured semiconductor substrates,
  wherein the training of the neural network may be performed according to deep learning technique, and
  wherein the neural network training unit may be further configured to generate the information used for training the neural network by:
    receiving the images of the manufactured semiconductor substrates and quality information indicating, for each one of the received images, quality of a manufactured semiconductor substrate in said one of the received images;
    providing one of the received images to the machine learning device as an input;
    obtaining an output from the machine learning device in response to the provision of said one of the received images; and
    comparing the obtained output from the machine learning device with the quality of the manufactured semiconductor substrate in the image provided to the machine learning device, the quality of the manufactured semiconductor substrate being indicated in the received quality information.

According to another aspect, an evaluation system is provided. The evaluation system may comprise:
  the evaluation device according to any one of the above stated aspect and examples; and the machine learning device configured to receive the image of the semiconductor substrate, perform computation using the received image, and output information indicating the quality of the semiconductor substrate based on a result of the computation.

In some examples, the evaluation system may further comprise:
an instruction generation unit configured to generate an instruction to the semiconductor substrate manufacturing apparatus as to processing of the semiconductor substrate based on the output from the evaluation device and the output from the machine learning device for the image of the semiconductor substrate; and
a communication interface configured to communicate the instruction to the semiconductor substrate manufacturing apparatus.

According to yet another aspect, a semiconductor substrate manufacturing system is provided. The semiconductor substrate manufacturing system may comprise:
the evaluation system according to any one of the above-stated aspect and examples;
the semiconductor substrate manufacturing apparatus configured to manufacture the semiconductor substrate; and
the imaging device provided on the semiconductor substrate manufacturing apparatus,
wherein the semiconductor substrate manufacturing apparatus is further configured to:
receive the instruction from the communication interface of the evaluation system; and
process the semiconductor substrate according to the received instruction.

According to yet another aspect, an evaluation method for evaluating quality of a semiconductor substrate manufactured by a semiconductor substrate manufacturing apparatus is provided. The evaluation method may comprise:
receiving, by a processor, an image of the semiconductor substrate, the image being captured by an imaging device provided on the semiconductor substrate manufacturing apparatus;
determining, by the processor, using a neural network, at least one value representative of a probability of a machine learning device outputting an erroneous output for the image of the semiconductor substrate, the machine learning device being configured to: (i) receive the image of the semiconductor substrate, (ii) perform computation using the received image, (iii) and output information indicating the quality of the semiconductor substrate based on a result of the computation; and
outputting, by the processor, an output based on the at least one value representative of the probability,
wherein the neural network has been trained using:
images of manufactured semiconductor substrates; and
information indicating, for each one of the images of the manufactured semiconductor substrates, a level of erroneousness for an output from the machine learning device for said one of the images of the manufactured semiconductor substrates.

According to yet another aspect, a method is provided for training a neural network to determine at least one value representative of a probability of a machine learning device outputting an erroneous output for an image of a semiconductor substrate, the machine learning device being configured to: (i) receive the image of the semiconductor substrate, (ii) perform computation using the received image, and (iii) output information indicating quality of the semiconductor substrate based on a result of the computation. The method may comprise:
receiving images of manufactured semiconductor substrates and information indicating, for each one of the images of the manufactured semiconductor substrates, a level of erroneousness for an output from the machine learning device for said one of the images of the manufactured semiconductor substrates; and
training the neural network using the received images as inputs to the neural network and the received information as supervisory data, wherein the training may be according to deep learning technique.

According to yet another aspect, a computer program product is provided. The computer program product may comprise computer-readable instructions that, when loaded and run on a computer, cause the computer to perform the method according to any one of the methods according to the above-stated aspects.

According to yet another aspect, an evaluation device for evaluating quality of a product manufactured by a manufacturing apparatus is provided. The evaluation device may comprise:
a receiving unit configured to receive an image of the product, the image being captured by an imaging device provided on the manufacturing apparatus;
a determination unit configured to determine, using a neural network, at least one value representative of a probability of a machine learning device outputting an erroneous output for the image of the product, the machine learning device being configured to: (i) receive the image of the product, (ii) perform computation using the received image, and (iii) output information indicating the quality of the product based on a result of the computation; and
an output unit configured to output an output based on the at least one value representative of the probability,
wherein the neural network has been trained using:
images of manufactured products; and
information indicating, for each one of the images of the manufactured products, a level of erroneousness for an output from the machine learning device for said one of the images of the manufactured products.

According to yet another aspect, an evaluation method for evaluating quality of a product manufactured by a manufacturing apparatus is provided. The evaluation method may comprise:
receiving, by a processor, an image of the product, the image being captured by an imaging device provided on the manufacturing apparatus;
determining, by the processor, using a neural network, at least one value representative of a probability of a machine learning device outputting an erroneous output for the image of the product, the machine learning device being configured to: (i) receive the image of the product, (ii) perform computation using the received image, and (iii) output information indicating the quality of the product based on a result of the computation; and
outputting, by the processor, an output based on the at least one value representative of the probability,
wherein the neural network has been trained using:
images of manufactured products; and
information indicating, for each one of the images of the manufactured products, a level of erroneousness for an output from the machine learning device for said one of the images of the manufactured products.

According to yet another aspect, a determination device is provided for determining error of an output from a machine learning device that is configured to: (i) receive input data in a predetermined format, (ii) perform computation using the input data, and (iii) provide a result of the computation as the output. The determination device may comprise:

a receiving unit configured to receive data having a format corresponding to the predetermined format;

a determination unit configured to determine, using a neural network, at least one value representative of a probability of the machine learning device outputting an erroneous output for input data corresponding to the received data; and an output unit configured to output an output based on the at least one value representative of the probability, wherein the neural network has been trained using:

training data having the format corresponding to the predetermined format; and information indicating, for each element of the training data, a level of erroneousness for an output from the machine learning device for input data corresponding to the element of the training data.

In various embodiments and examples described herein, the "predetermined format" of the input data for the machine learning device may be a format suitable for computation performed by the machine learning device. For example, in case the machine learning device is configured to process image data, the "predetermine format" may represent a format of image data including pixels with intensity values. Other examples of the "predetermined format" of the input data for the machine learning device are described later herein.

In various embodiments and examples described herein, the term "a format corresponding to the predetermined format" may be understood as including a format identical to the predetermined format. Further, in various embodiments and examples described herein, a "format" of data may be understood as information specifying parameters to be included in the data having that format. Thus, in various embodiments and examples described herein, "data having a format corresponding to the predetermined format" may include at least one parameter that is identical to a parameter included in data having the predetermined format.

According to yet another aspect, a computer-implemented method is provided for determining error of an output from a machine learning device that is configured to: (i) receive input data in a predetermined format, (ii) perform computation using the input data, and (iii) provide a result of the computation as the output. The method may comprise:

receiving data having a format corresponding to the predetermined format;

determining, using a neural network, at least one value representative of a probability of the machine learning device outputting an erroneous output for input data corresponding to the received data; and outputting an output based on the at least one value representative of the probability, wherein the neural network has been trained using:

training data having the format corresponding to the predetermined format; and information indicating, for each element of the training data, a level of erroneousness for an output from the machine learning device for input data corresponding to the element of the training data.

The subject matter described in the application can be implemented as a method or as a system, possibly in the form of one or more computer program products. The subject matter described in the application can be implemented in a data signal or on a machine readable medium, where the medium is embodied in one or more information carriers, such as a CD-ROM, a DVD-ROM, a semiconductor memory, or a hard disk. Such computer program products may cause a data processing apparatus to perform one or more operations described in the application.

In addition, subject matter described in the application can also be implemented as a system including a processor, and a memory coupled to the processor. The memory may encode one or more programs to cause the processor to perform one or more of the methods described in the application. Further subject matter described in the application can be implemented using various machines.

BRIEF DESCRIPTION OF THE DRAWINGS

Details of one or more implementations are set forth in the exemplary drawings and description below. Other features will be apparent from the description, the drawings, and from the claims. It should be understood, however, that even though embodiments are separately described, single features of different embodiments may be combined to further embodiments.

DETAILED DESCRIPTION OF EMBODIMENTS

In the following text, a detailed description of examples will be given with reference to the drawings. It should be understood that various modifications to the examples may be made. In particular, elements of one example may be combined and used in other examples to form new examples.

Hardware Configuration

Figure 1:
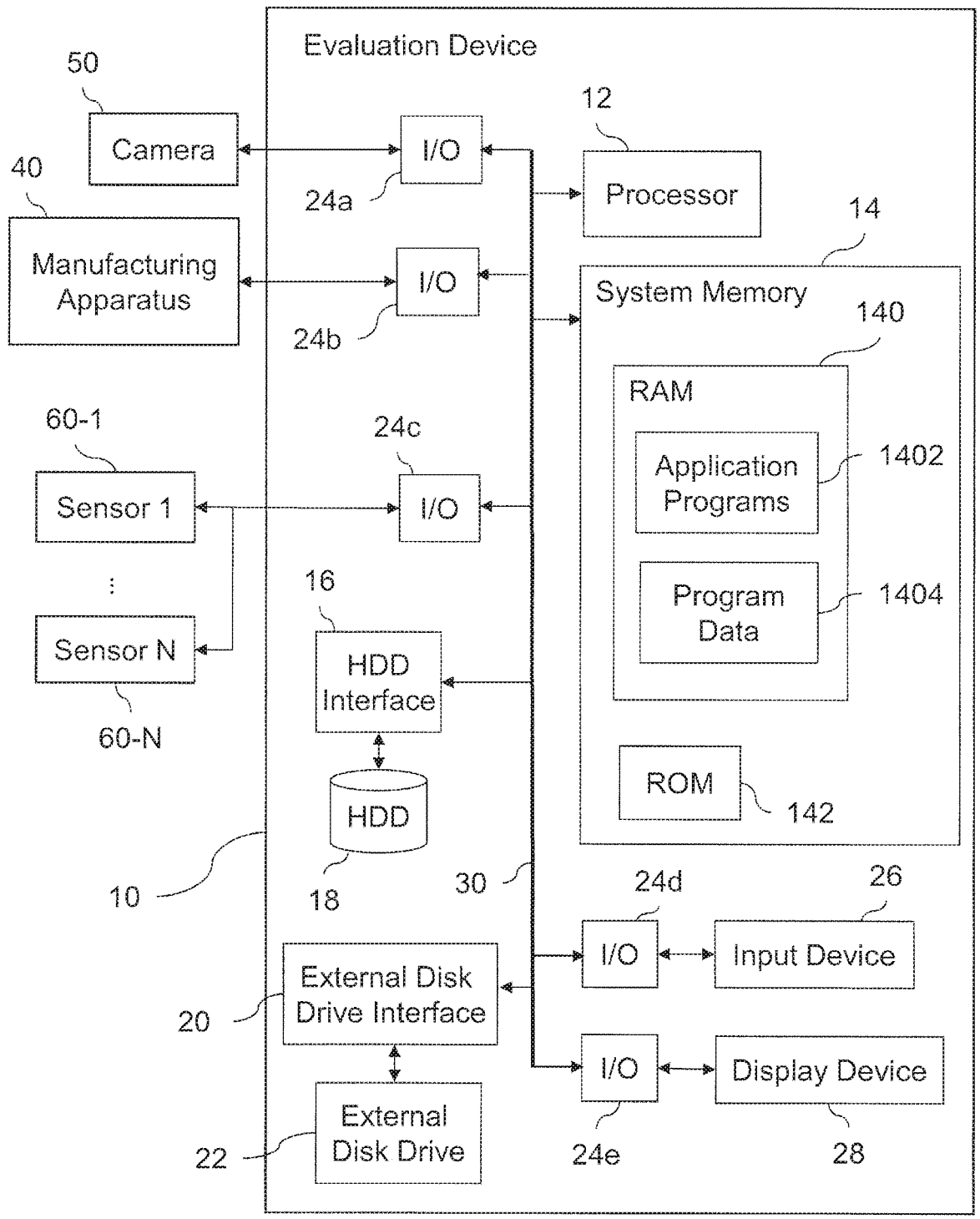
FIG. 1 shows an exemplary hardware configuration of an evaluation system according to an exemplary embodiment.

FIG. 1 shows an exemplary hardware configuration of an evaluation system according to an exemplary embodiment.

In FIG. 1, a system 1 comprises an evaluation device 10, a manufacturing apparatus 40, a camera 50 and one or more sensors 60-1, . . . , 60-N.

The evaluation device 10 may be implemented by a general purpose computer. For example, as shown in FIG. 1, the evaluation device 10 may comprise a processor 12, a system memory 14, hard disk drive (HDD) interface 16, external disk drive interface 20, and input/output (I/O) interfaces 24. These components of the evaluation device 10 are coupled to each other via a system bus 30. The processor 12 may perform arithmetic, logic and/or control operations by accessing the system memory 14. The system memory 14 may store information and/or instructions for use in combination with the processor 12. The system memory 14 may include volatile and non-volatile memory, such as a random access memory (RAM) 140 and a read only memory (ROM) 142. A basic input/output system (BIOS) containing the basic routines that helps to transfer information between elements within the general purpose computer, such as during start-up, may be stored in the ROM 142. The system bus 30 may be any of several types of bus structures including a memory bus or memory controller, a peripheral bus, and a local bus using any of a variety of bus architectures.

The evaluation device shown in FIG. 1 may include a hard disk drive (HDD) 18 for reading from and writing to a hard disk (not shown), and an external disk drive 22 for reading from or writing to a removable disk (not shown). The removable disk may be a magnetic disk for a magnetic disk drive or an optical disk such as a CD ROM for an optical disk drive. The HDD 18 and the external disk drive 22 are connected to the system bus 30 by a HDD interface 16 and an external disk drive interface 20, respectively. The drives and their associated computer-readable media provide non-volatile storage of computer-readable instructions, data structures, program modules and other data for the general purpose computer. The data structures may include relevant data for the implementation of one or more methods according to various aspects and examples as described herein. The relevant data may be organized in a database, for example a relational or object database.

Although the exemplary environment described herein employs a hard disk (not shown) and an external disk (not shown), it should be appreciated by those skilled in the art that other types of computer readable media which can store data that is accessible by a computer, such as magnetic cassettes, flash memory cards, digital video disks, random access memories, read only memories, and the like, may also be used in the exemplary operating environment.

A number of program modules may be stored on the hard disk, external disk, ROM 142 or RAM 140, including an operating system (not shown), one or more application programs 1402, other program modules (not shown), and program data 1404. The application programs and corresponding methods may include at least a part of the functionality as will be described below, referring to FIGS. 2 to 13.

The evaluation device 10 shown in FIG. 1 may also include an input device 26 such as mouse and/or keyboard, and display device 28, such as liquid crystal display. The input device 26 and the display device 28 are connected to the system bus 30 via I/O interfaces 24d, 24e.

It should be noted that the above-described evaluation device 10 employing a general purpose computer is only one example of an implementation of the exemplary embodiments described herein. For example, the evaluation device 10 may include additional components not shown in FIG. 1, such as one or more network interfaces for communicating with other devices and/or computers via wired and/or wireless communication for data exchange.

In addition or as an alternative to an implementation using a general purpose computer as shown in FIG. 1, a part or all of the functionality of the exemplary embodiments described herein may be implemented as one or more hardware circuits. Examples of such hardware circuits may include but are not limited to: Large Scale Integration (LSI), Application Specific Integrated Circuit (ASIC) and Field Programmable Gate Array (FPGA).

The camera 50 shown in FIG. 1 may be an imaging device comprising, e.g., a CCD sensor that can capture one or more images of a scene. The camera 50 may be connected to the system bus 30 of the general purpose computer implementing the evaluation device 10 via the I/O interface 24a in wired and/or wireless communication. In various exemplary embodiments as described herein, the camera 50 may capture one or more images of an object or a part thereof that is subject to evaluation and/or classification. The object may be a product manufactured by a manufacturing apparatus. Examples of the product may include, but may not be limited to, a semiconductor substrate, a substrate with soldered components, a resin substrate and a liquid crystal. For example, the camera 50 shown in FIG. 1 may capture an image of a semiconductor substrate manufactured by a manufacturing apparatus 40. The semiconductor substrate may be a substrate for an integrated circuit (IC), for example. An image captured by the camera 50 may include a 2D array of pixels. Each of the pixels may include at least one value. For example, a pixel in a grey scale image may include one value indicating an intensity of the pixel. A pixel in a color image may include multiple values, for example three values, that indicate coordinates in a color space such as RGB color space.

The manufacturing apparatus 40 may be an apparatus configured to manufacture products. In some examples, the manufacturing apparatus 40 may be a semiconductor substrate manufacturing apparatus configured to manufacture semiconductor substrates. The camera 50 may be provided on the manufacturing apparatus 40, at a location suitable for capturing an image of a product manufactured by the manufacturing apparatus 40. The manufacturing apparatus 40 may be connected to the system bus 30 of the general purpose computer implementing the evaluation device 10 via the I/O interface 24b.

Further, in some examples, one or more sensors 60-1, . . . , 60-N may be connected to the system bus 30 of the general purpose computer implementing the evaluation device 10 via the I/O interface 24c in wired and/or wireless communication. Each of the sensors 60-1, . . . , 60-N may be configured to detect a value of a physical parameter that may represent an environment in which the manufacturing apparatus 40 is provided. For example, the one or more sensors 60-1, . . . , 60-N may be one or more of: a temperature sensor, a humidity sensor, a brightness sensor, an atmospheric pressure sensor. In other examples where sensor values are not required for the processing performed by the evaluation device 10, no sensor may be connected to the system bus 30 of the general purpose computer implementing the evaluation device 10 via the I/O interface 24c.

In the following, exemplary embodiments will be described with respect to an exemplary case where the manufacturing apparatus 40 is a semiconductor substrate manufacturing apparatus and quality of semiconductor substrates manufactured by the manufacturing apparatus 40 are to be evaluated. It should be noted, however, other examples of the present disclosure may be employed for applications other than evaluating the quality of manufactured semiconductor substrates, as will be described later herein.

Functional Configurations

Figure 2:
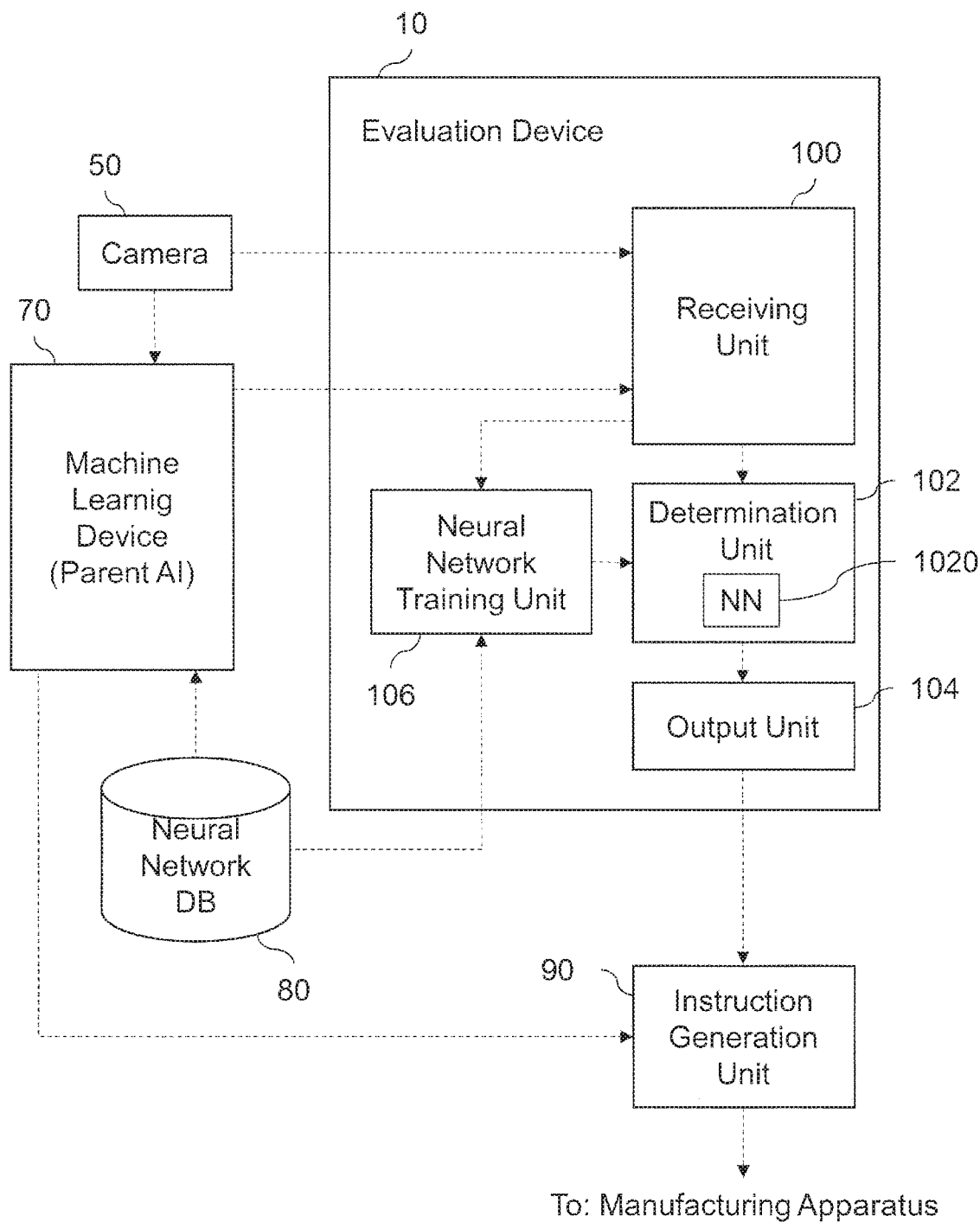
FIG. 2 shows an exemplary functional block diagram of the evaluation system.

FIG. 2 shows an exemplary functional block diagram of the evaluation system. The evaluation system shown in FIG. 2 may include the evaluation device 10, the camera 50, a machine learning device 70, a neural network database (DB) 80 and/or an instruction generation unit 90.

The machine learning device 70 may be a device for evaluating manufactured semiconductor substrates using AI. For example, the machine learning device 70 may evaluate quality of semiconductor substrates and classify the semiconductor substrates into a specific (predetermined or predeterminable) number of groups according to the quality. An output from the machine learning device 70 may be evaluated by the evaluation device 10. Hereinafter, the machine learning device 70 is referred to also as a parent AI.

In order for evaluating products such as manufactured semiconductor substrates, the machine learning device 70 may be configured to: (i) receive an image of a semiconductor substrate from the camera 50 provided on the manufacturing apparatus 40, (ii) perform computation using the received image, and (iii) output information indicating the quality of the semiconductor substrate in the received image based on the result of the computation. The computation may be based on a known machine learning technique, for example, a technique involving neural networks.

Figure 3:
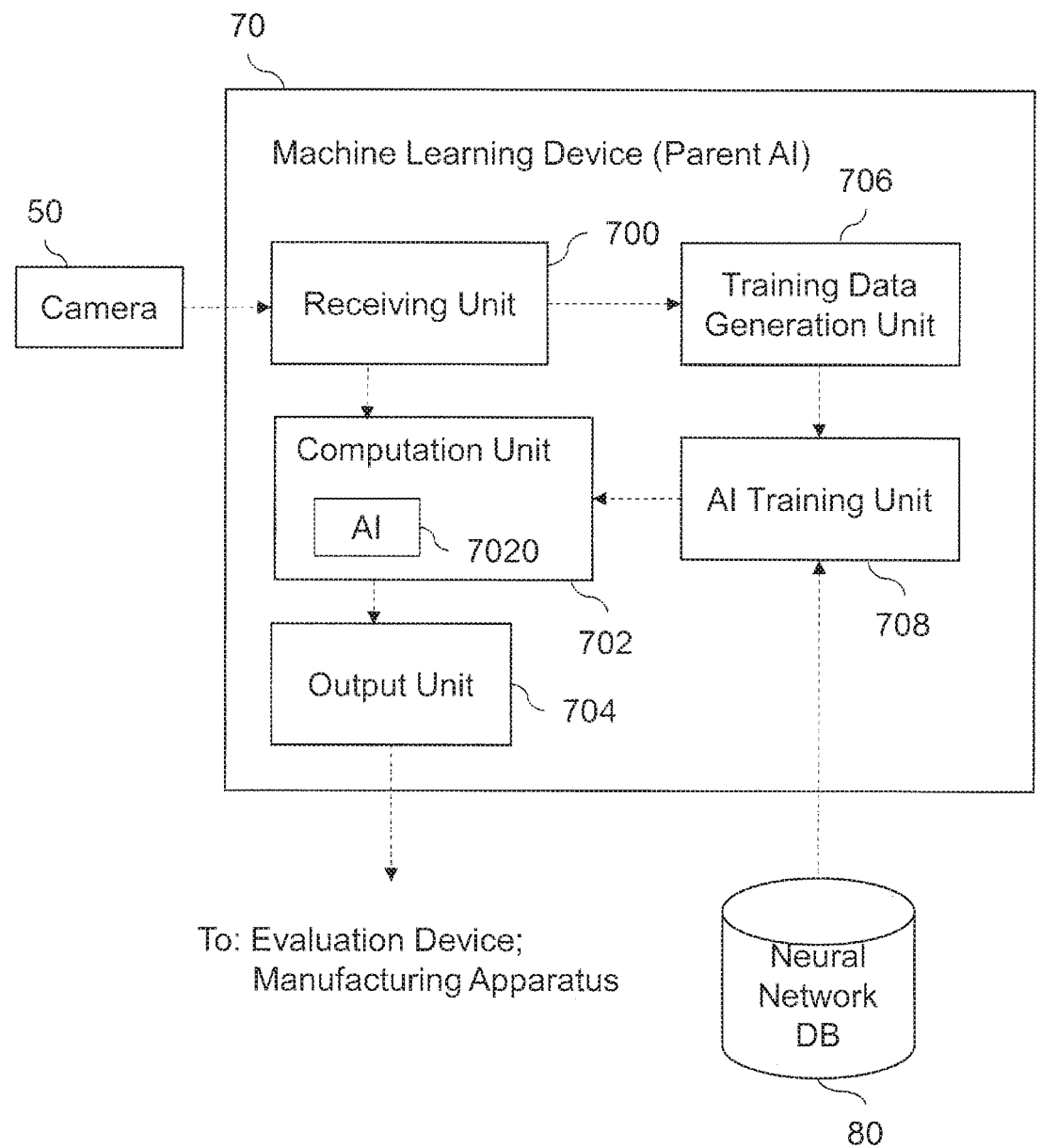
FIG. 3 shows an exemplary functional block diagram of a machine learning device.

FIG. 3 shows an exemplary functional block diagram of the machine learning device 70. The machine learning device 70 shown in FIG. 3 may include a receiving unit 700, a computation unit 702, an output unit 704, a training data generation unit 706 and/or an AI training unit 708.

The receiving unit 700 may be configured to receive inputs to the machine learning device 70 from other device(s). For example, as shown in FIG. 3, the receiving unit 700 may be configured to receive an image of a semiconductor substrate from the camera 50 provided on the manufacturing apparatus 40. Further, for example, the receiving unit 700 may be configured to receive sensor information from one or more sensors 60 (not shown in FIG. 3), if necessary for the computation made by the machine learning device 70. The receiving unit 700 may be further configured to receive user inputs from an input device (not shown) such as a mouse or a keyboard.

The computation unit 702 may be configured to perform computation using the input(s) received by the receiving unit 700. For instance, the computation unit 702 may be configured to perform computation using the image received from the camera 50. The computation unit 702 may include an AI 7020 which is used for the computation. In some examples, the AI 7020 may comprise a convolutional neural network (CNN) that is known as a neural network suitable for image recognition. An exemplary application of a CNN to evaluation of a semiconductor substrate will be described below with reference to FIGS. 4 to 6.

Figure 4:
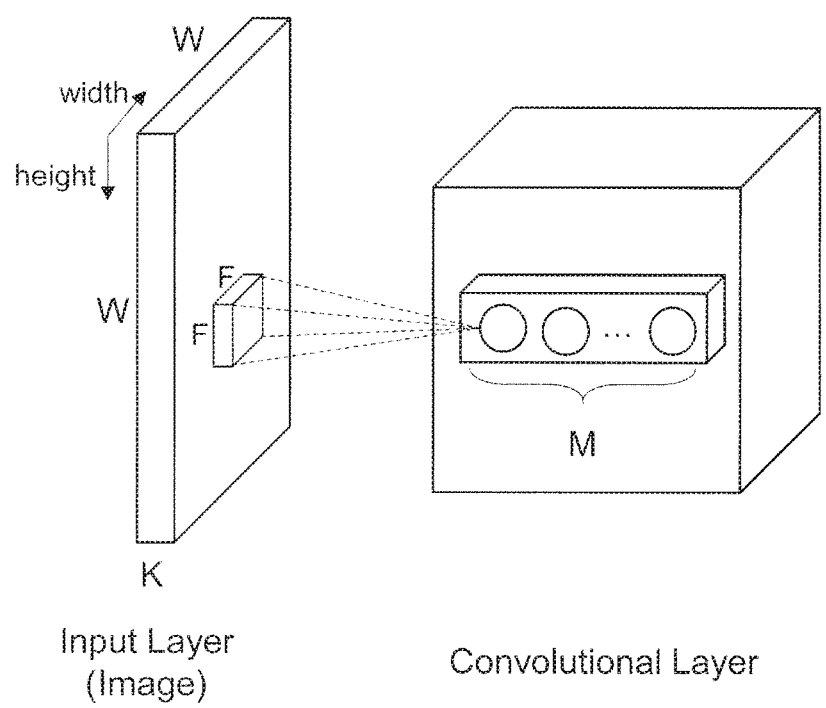
FIG. 4 shows a schematic diagram illustrating an exemplary input layer and an exemplary convolutional layer of a convolutional neural network (CNN).

FIG. 4 shows a schematic diagram illustrating an exemplary input layer and an exemplary convolutional layer of a CNN. In the CNN shown in FIG. 4, an input image having W×W (W=1, 2, 3, . . . ) pixels for K (K=1, 2, 3, . . . ) channels (e.g., three channels corresponding to Red, Green and Blue) can be input to the input layer. In this example, the input image may be an image of a semiconductor substrate. An intensity value of a pixel for a channel can be considered as an input value to an input node of the input layer. In other words, the input layer may include W×W×K input nodes, each of which corresponding to an intensity value of a channel of a pixel.

Each node of the convolutional layer of the CNN shown in FIG. 4 may correspond to a filter having a size of F×F (F=1, 2, 3, . . . ; F<W), applied to a part of the input image. As shown in FIG. 4, M (M=1, 2, 3, . . . ) filters may be applied to the same part of the input image over the K channels. An output of each node in the convolutional layer may be represented as follows by equation (1):

$$y = f(\Sigma_{i=0}^{F \times F \times K - 1} w_i x_i + b) \tag{1}$$

where $x_i$ may represent an input value to an input node (e.g., an intensity value of a pixel for a channel within the region covered by the corresponding filter); $w_i$ may represent an adjustable weight for a connection between the node in the convolutional layer and the input node corresponding to $x_i$; and b may represent a bias parameter. The activation function f may be a rectified linear unit, f(x)=max(x, 0).

In some examples, each of the M filters may be applied to the whole area of the input image by sliding the filter with a stride of S pixel(s) in both width and height directions shown in FIG. 4. For each location of the M filters on the input image, M nodes corresponding to the M filters may be present in the convolutional layer. In case of S=1, the number of outputs of the convolutional layer may be W×W×M. The outputs of the convolutional layer may be considered as M images (corresponding to M filters) with a size of W×W.

The outputs of the convolutional layer may be subject to down-sampling by a max pooling operation. The max pooling operation may select the maximum value among a plurality of input values. The max pooling operation may be applied to each of the M images with a size of W×W, output from the convolutional layer as stated above.

Figure 5:
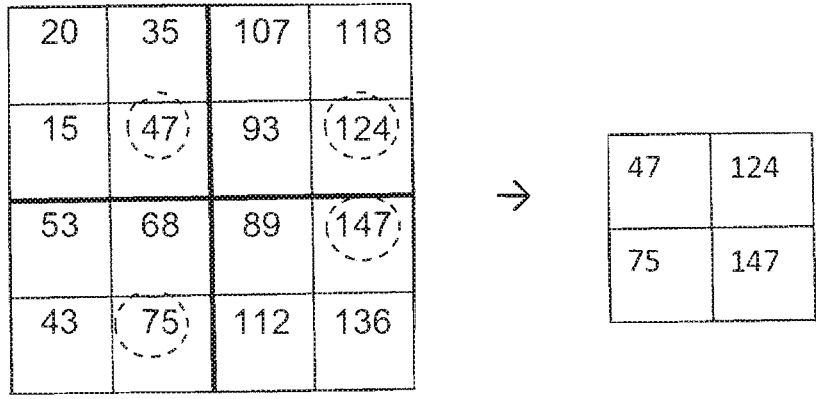
FIG. 5 shows a schematic diagram illustrating an exemplary max pooling operation.

FIG. 5 shows a schematic diagram illustrating an exemplary max pooling operation. In the exemplary max pooling operation as shown in FIG. 5, filters having a size of 2×2 may be applied to an input image (to the max pooling operation) with a stride of two pixels. This may result in an output image including pixels each of which has the maximum intensity value among the pixels of the input image within the corresponding filter. Each filter used in the max pooling operation may be considered as a node of a pooling layer comprised in a CNN.

The outputs of the pooling layer may be input to another convolutional layer. Alternatively, the outputs of the pooling layer may be input to a neural network called fully connected neural network, where each node of the fully connected neural network is connected to all the outputs (e.g. nodes) of the pooling layer. The outputs of the fully connected neural network may be connected either to another fully connected neural network or an output layer.

The output layer may include one or more nodes corresponding to one or more desired output parameters of the CNN. For example, in the exemplary embodiments, the output layer may include an output node indicating the quality of the semiconductor substrate in the input image captured by the camera 50. In other examples, the output layer may include two output nodes, one indicating a likelihood that the quality of the semiconductor substrate in the input image is acceptable for its intended purpose, the other indicating a likelihood that the quality is not acceptable. In yet other examples, the output layer may include three or more output nodes, each of which indicating a likelihood that the quality of the semiconductor substrate in the input image belongs to one of the predefined classes of quality (e.g., high, ordinary, low etc.). Each output node may comprise a softmax function as the activation function. When the output layer includes two or more nodes, the CNN may be considered as solving a classification problem to classify the semiconductor substrate in the input image into one of a specified (predetermined or predeterminable) number of groups.

Figure 6:
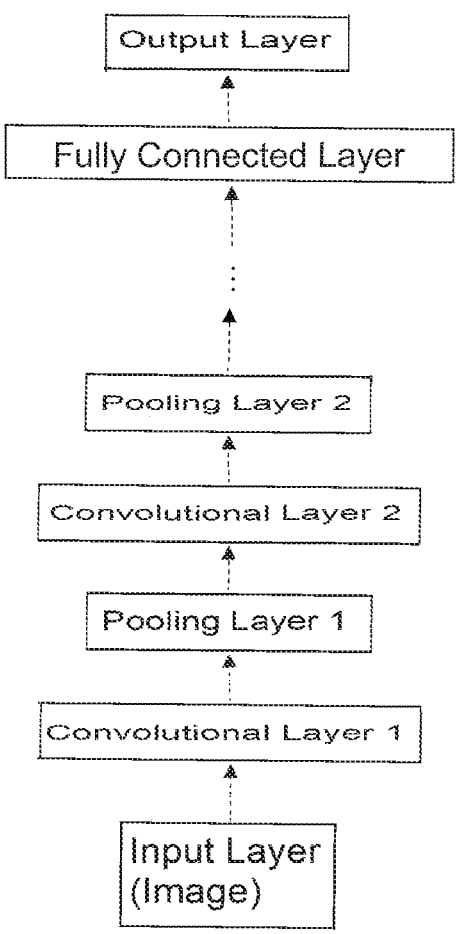
FIG. 6 shows an exemplary configuration of a CNN.

FIG. 6 shows an exemplary configuration of a CNN. The CNN as shown in FIG. 6 includes an input layer, a convolutional layer 1, a pooling layer 1, a convolutional layer 2, a pooling layer 2, a fully connected layer and an output layer. The convolutional layers 1, 2 and the pooling layers 1, 2 may have the configurations as explained above with reference to FIGS. 4 and 5. As also mentioned above, a CNN may include more pairs of a convolutional layer and a pooling layer. Further, a CNN may include a sequence of convolutional layers without having a pooling layer in between the adjacent convolutional layers, as long as the last convolutional layer of the sequence is connected to a pooling layer. Further, a CNN may include more than one fully connected layers right before the output layer.

Further details of known CNN techniques which may be applied in connection with the present disclosure may be found in, for example, Okatani, "Deep Learning and Image Recognition, —Basics and Current Trends—" (in the Japanese language), Operations research as a management science research, 60(4), p. 198-204, The Operations Research Society of Japan, Apr. 1, 2015, and Anonymus, "Convolutional neural network", Wikipedia (URL: https://en.wikipedia.org/wiki/Convolutional_neural_network).

Referring again to FIG. 3, the output unit 704 of the machine learning device 70 may be configured to output information indicating quality of the semiconductor substrate in the received image based on a result of the computation performed by the computation unit 702. For instance, the information output from the output unit 704 may indicate whether or not the quality of the semiconductor substrate is acceptable to be used for the intended purpose of the semiconductor substrate. In some examples where the AI 7020 of the computation unit 702 comprises a CNN as described above, the output unit 704 may be configured to receive the output value(s) of the output node(s) of the CNN and to output information indicating the quality of the semiconductor substrate based on the received output value(s). For example, in case the CNN has two output nodes, one indicating a likelihood of acceptable quality and the other indicating a likelihood of inacceptable quality, the output unit 704 may output information indicating that the quality is acceptable or inacceptable, depending on which output node has output a higher value. The output from the output unit 704 may be provided to the evaluation device 10 and/or the manufacturing apparatus 40, for example.

The training data generation unit 706 may be configured to generate training data for training the AI 7020 of the computation unit 702. For instance, in case the AI 7020 comprises a CNN as stated above, the training data may include a set of combinations of an input image, e.g., of a semiconductor substrate, and a desired output for the input image, e.g., information indicating quality of the semiconductor substrate in the image. The information indicating quality of the semiconductor substrate may be obtained from a user input, for instance. Further, for example, the set of images and the quality information may be obtained by capturing images of semiconductor substrates that are known to have a certain quality. The desired output for the input image may be set according to the number of output nodes included in the output layer of the CNN. The desired output may be considered as a supervisory signal for training the AI 7020.

The AI training unit 708 may be configured to train the AI 7020 using the training data generated by the training data generation unit 706. For instance, when the AI 7020 comprises a CNN as stated above, the AI training unit 708 may be configured to adjust the adjustable weights of the convolutional layer(s) included in the CNN (see equation (1) above) and the weights of the fully connected neural network(s) included in the CNN (see e.g., FIG. 6) by back-propagation method using the training data.

In some examples, the AI training unit 708 may be configured to obtain a data structure of the CNN from the neural network DB 80.

The neural network DB 80 may be a database storing data structures of neural networks with various configurations. For example, the neural network DB 80 may store the data structures of neural networks having an input layer with various numbers of nodes, one or more hidden layers with various numbers of nodes, an output layer with various numbers of nodes and various weighted connections between nodes. Further, for example, the neural network DB 80 may store the data structures of CNN as explained above with reference to FIGS. 4 to 6. The neural networks stored in the neural network DB 80 may not have been trained for any specific purpose.

In some examples, the training data generation unit 706 and/or the AI training unit 708 may be provided in a device separate from the machine learning device 70 rather than as a part of the machine learning device 70.

The machine learning device 70 as described above with reference to FIG. 3 may be implemented using a general purpose computer having a configuration analogous to that of the general purpose computer shown in FIG. 1 for implementing the evaluation device 10.

Referring again to FIG. 2, the evaluation device 10 may include a receiving unit 100, a determination unit 102, an output unit 104 and a neural network training unit 106.

The receiving unit 100 may be configured to receive an image of a semiconductor substrate, captured by the camera 50 provided on the manufacturing apparatus 40. Further, the receiving unit 100 may be configured to receive an output from the machine learning device 70, the parent AI. Further, for example, the receiving unit 100 may be configured to receive sensor information from one or more sensors 60 (not shown in FIG. 2), if necessary for the determination made by the determination unit 102. The receiving unit 100 may be further configured to receive user inputs from an input device (not shown) such as a mouse or a keyboard.

The determination unit 102 may include a neural network (NN) 1020. The determination unit 102 may be configured to determine, using the NN 1020, at least one value representative of a probability of the parent AI outputting an erroneous output for the image of the semiconductor substrate. The NN 1020 may be trained by the neural network training unit 106.

The neural network training unit 106 may be configured to train the NN 1020 for determining at least one value representative of a probability of the parent AI outputting an erroneous output for specified input data. The data structure of the NN 1020 may be obtained from the neural network DB 80. In the exemplary embodiments, the NN 1020 may be trained to output a value indicating or representative of a probability of the parent AI outputting an erroneous output for a particular image of a semiconductor substrate. In some examples, the neural network training unit 106 may be configured to train the neural network using training data including: images of manufactured semiconductor substrates; and information indicating, for each one of the images of the manufactured semiconductor substrates, a level of erroneousness for an output from the parent AI for said one of the images of the manufactured semiconductor substrates. The information indicating the level of erroneousness may represent, for example, whether or not the parent AI has output an erroneous output for said one of the images of the manufactured semiconductor substrates.

The information indicating the above-stated level of erroneousness may be obtained by, for example, inputting into the parent AI the particular image for which the quality of the semiconductor substrate in the image is known, obtaining an output from the parent AI and comparing the output from the parent AI with the known quality of the semiconductor substrate in the image. The information indicating the above-stated level of erroneousness may be used as a supervisory signal for training the NN 1020.

It should be noted that the set of images included in the training data for training the NN 1020 and the set of images included in the training data for training the AI 7020 of the parent AI may be identical, or have a partial overlap, or have no overlap. In preferred examples, the set of images included in the training data for training the NN 1020 may comprise at least one image that is not comprised in the set of images included in the training data for training the AI 7020 of the parent AI.

Although FIG. 2 shows the neural network training unit 106 as a part of the evaluation device 10, in some examples, the neural network training unit 106 may be provided on a device different from the evaluation device 10. In such examples, the evaluation device 10 may obtain, from the neural network training unit 106, the NN 1020 that has been trained by the neural network training unit 106.

In some examples, the NN 1020 may have the same configuration as the CNN as described above with reference to FIGS. 4 to 6. The output of the CNN comprised in the determination unit 102, however, may indicate the probability of the parent AI outputting an erroneous output, rather than the quality of the semiconductor substrate in the image. The training for the CNN as the NN 1020 to output the probability of the parent AI outputting an erroneous output may be performed in a manner analogous to that stated above for training the CNN as the AI 7020 of the parent AI, but using the information indicating a level of erroneousness for an output from the parent AI for said one of the images of the manufactured semiconductor substrates as the supervisory signal, instead of the information indicating the quality of the semiconductor substrates in the input images.

Figure 7A:
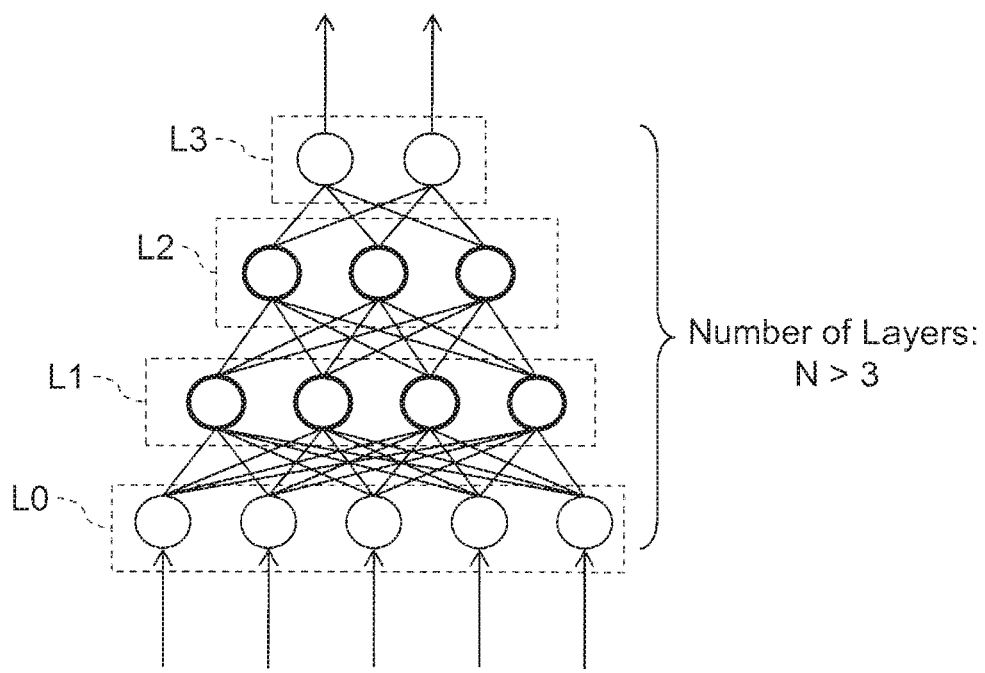
FIG. 7A shows an exemplary configuration of a neural network which may be trained using a deep learning technique.

In other examples, the NN 1020 may have a configuration as shown in FIG. 7A and may be trained using a known deep learning technique involving an autoencoder.

A neural network to be trained by a known deep learning technique may comprise more than three layers in total, including an input layer (e.g., layer L0 in FIG. 7A), two or more hidden layers (e.g., layers L1, L2 in FIG. 7A) and an output layer (e.g., layer L3 in FIG. 7A). Although FIG. 7A shows four layers, the neural network for deep learning may have more than four layers, e.g. more than two hidden layers. Further, each layer in the neural network for deep learning may have more number or less number of nodes than that shown in FIG. 7A. For example, in the exemplary embodiments where an image of a semiconductor substrate is processed, the input layer may include input nodes each of which includes an intensity value of a pixel in an input image of a semiconductor substrate.

Figure 7B:
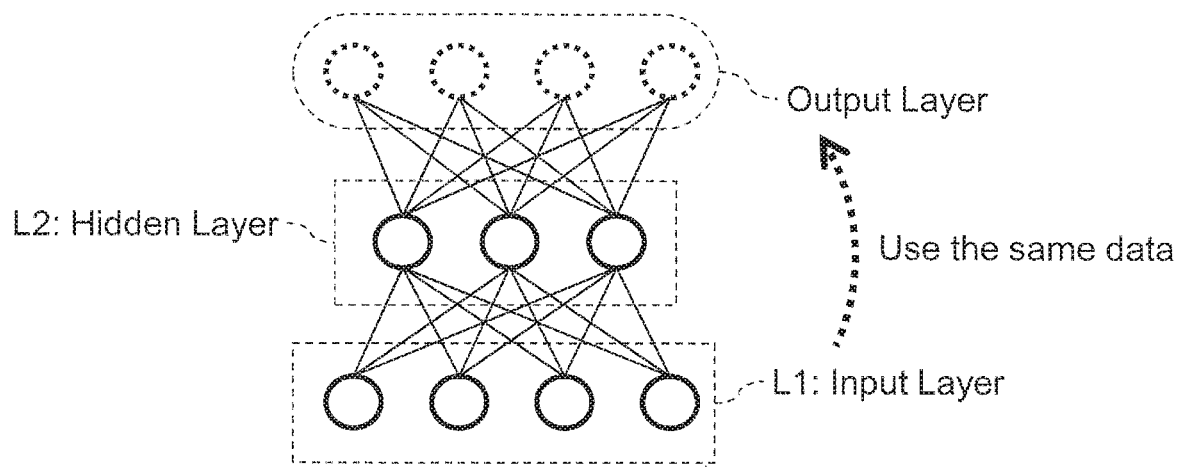
FIG. 7B shows how a hidden layer of the neural network shown in FIG. 7A can be trained in some examples.

When training the neural network as shown in FIG. 7A, weights of connections to each hidden layer of the neural network may be adjusted so as to build an autoencoder that learns a representation (e.g., encoding) for a set of data. For example, in order to train the hidden layer L2 shown in FIG. 7A, an autoencoder having a neural network shown in FIG. 7B may be constructed and trained. Referring to FIG. 7B, the layer L1 may be considered as an input layer connected to the hidden layer L2 and an output layer having the same number of nodes as the input layer L1 may be provided. It is noted that the layers L1 and L2 in FIG. 7B correspond to the layers L1 and L2 in FIG. 7A. The autoencoder shown in FIG. 7B may be trained using the input data to the input layer as the supervisory signal. In other words, the weights of the connections to the hidden layer L2 may be adjusted so that the output layer outputs the same data as the input data. Performing such training may result in the hidden layer of the autoencoder to represent compressed information of the input data, in other words, represent characteristics or features of the input data. The training of an autoencoder as shown in FIG. 7B may be iterated for each of the hidden layers of the neural network as shown in FIG. 7A.

Several techniques may be applied for improving robustness of an autoencoder. For example, partially corrupted input (e.g., input with added noise) may be used while training the autoencoder to recover the original undistorted input. Further, for example, sparsity may be imposed on the hidden layer (e.g., providing more nodes in the hidden layer than in the input layer) during training and the autoencoder may be trained so that only a specified percentage of nodes in the hidden layer are active. For further example, one or more nodes in the hidden layer may be made inactive during training.

Either in case of employing the CNN (see e.g., FIGS. 4 to 6) or the neural network trained using an autoencoder (see FIGS. 7A and 7B) as the NN 1020 of the evaluation device 10, the output layer of the NN 1020 may include, for instance, a single node that may output one or more values representative of the probability of the parent AI outputting an erroneous output for the input data. In case of using a single node in the output layer, the desired output value (e.g. supervisory signal) of the single output node may be set to a predetermined value (e.g., 0) when the parent AI has output a correct output for the input data and to another predetermined value (e.g., 1) when the parent AI has output an erroneous output for the input data. Further, for example, the output layer of the NN 1020 may include two nodes, one corresponding to a probability of the parent AI outputting a correct output for the input data, the other corresponding to a probability of the parent AI outputting an erroneous output for the input data.

Referring again to FIG. 2, the output unit 104 may be configured to output an output based on the at least one value representative of the probability determined by the determination unit 102. In some examples, the output by the output unit 104 may be identical to the output by the NN 1020 of the determination unit 102. In other examples, an output value output from the output unit 104 may be determined based on the output by the NN 1020 of the determination unit 102. For instance, in case the NN 1020 outputs a single value y (e.g., $0 \leq y \leq 1.0$) indicating or representative of the probability of the parent AI outputting an erroneous output, the output value from the output unit 104 may represent a percentage value corresponding to the probability. Alternatively, the output value from the output unit 104 may take either one of two values, one corresponding to correct and the other corresponding to erroneous, determined by, for example, checking whether or not the single output value y of the NN 1020 exceeds a predetermined threshold. Further, also in case the NN 1020 outputs two values, each indicating or being representative of the probability of the parent AI outputting an erroneous or correct output, the output value from the output unit 106 may represent a percentage value corresponding to the probability of the parent AI outputting an erroneous (or correct) output or may take either one of two values, one corresponding to correct and the other corresponding erroneous, determined by, for example, selecting the more probable of the two outputs from the NN 1020.

The output from the output unit 106 may be provided to the instruction generation unit 90.

The instruction generation unit 90 may be configured to generate an instruction to a manufacturing apparatus 40 as to processing of the semiconductor substrate based on the output from the output unit 106 of the evaluation device 10 and the output from the parent AI for the image of the semiconductor substrate. For example, in case the parent AI is configured to output whether or not the quality of the semiconductor substrate is acceptable, the following combinations of the outputs from the parent AI and the output unit 106 of the evaluation device 10 may be present as shown in Table 1 below.

unit 90 may be implemented as a device separate from both the evaluation device 10 and the semiconductor substrate manufacturing device 40.

Evaluation Process

Figure 8:
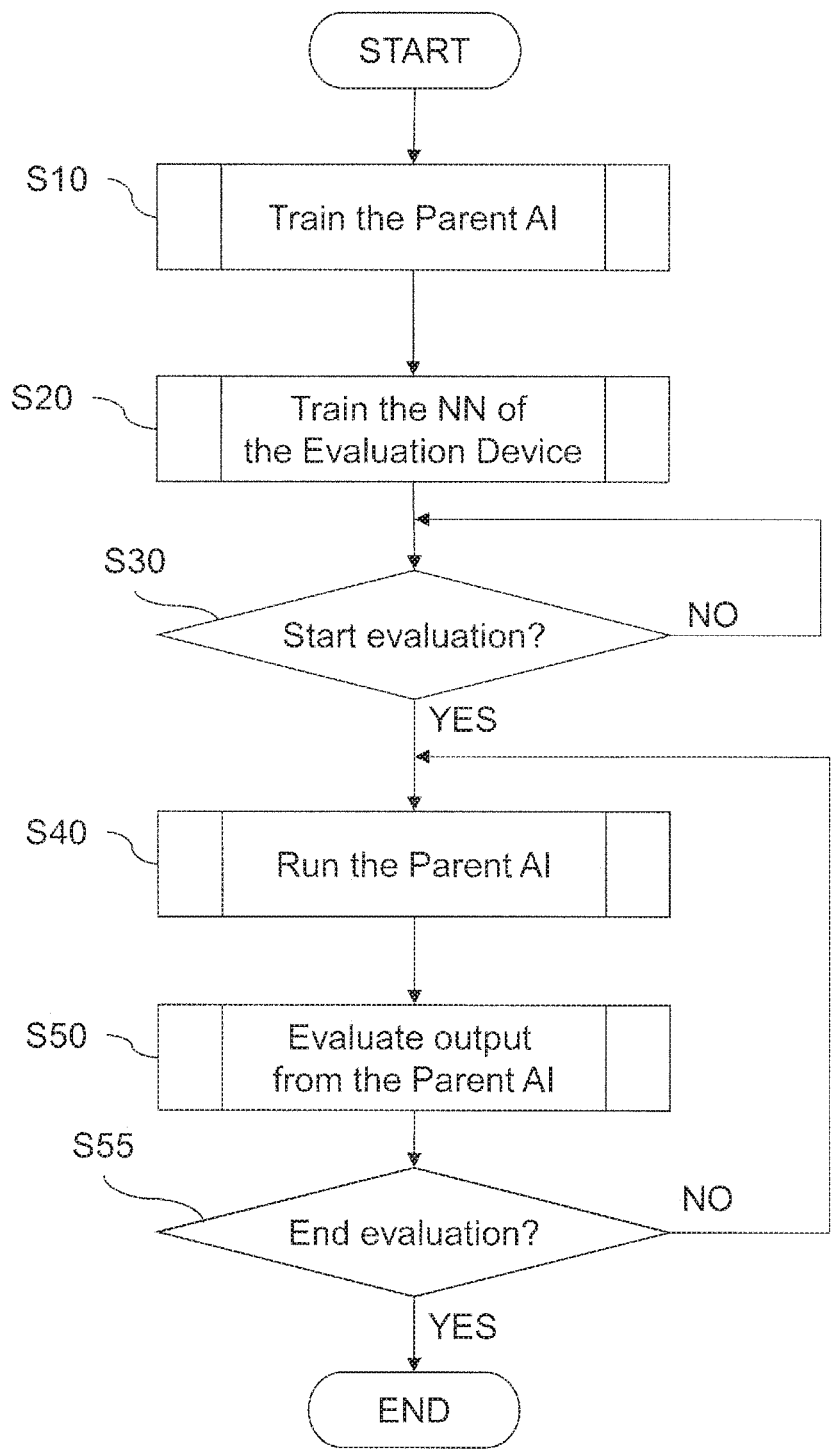
FIG. 8 shows a flowchart of exemplary processing performed by the evaluation system.

FIG. 8 shows a flowchart of exemplary processing performed by the evaluation system. The processing of FIG. 8 may be started, for example, in response to a user input instructing the system to start the processing.

In step S10 of FIG. 8, the training of the parent AI may be performed as described later in more detail with reference to FIG. 9.

After the parent AI is trained in step S10, the training of the NN 1020 of the evaluation device 10 may be performed in step S20 as described later in more detail with reference to FIG. 10.

After the NN 1020 of the evaluation device 10 is trained in step S30 of FIG. 8, a determination may be made as to whether or not to start evaluation of an output from the parent AI. It may be determined to start the evaluation when a signal indicating start of manufacturing by the manufacturing apparatus 40 is received at the parent AI and the evaluation device 10, for example. If it is determined to start the evaluation (YES at step S30), the processing may proceed to step S40. If not (NO at step S30), the processing

TABLE 1

Combinations of outputs and exemplary instructions

| Quality of the semiconductor substrate (output of the parent AI) | Probability of the parent AI outputting an erroneous output (output of the evaluation device) | Instruction to the manufacturing apparatus |
| --- | --- | --- |
| Acceptable | High | Transport the semiconductor substrate for further inspection. |
| Acceptable | Low | Let the semiconductor substrate proceed as a completed product. |
| Not acceptable | High | Transport the semiconductor substrate for further inspection. |
| Not acceptable | Low | Remove the semiconductor substrate from the production line. |

The instruction generation unit 90 may be configured to generate an instruction as shown in the right column of Table 1 depending on the combination of the outputs from the parent AI and the evaluation device, for example. The instructions shown in Table 1 are merely exemplary and the instruction generation unit 90 may be configured to generate other instructions with respect to the combinations of the outputs from the parent AI and the evaluation device.

The instruction generated by the instruction generation unit 90 may be communicated to the manufacturing apparatus 40 via a communication interface (not shown) configured to communicate the instruction to the manufacturing apparatus 40. The manufacturing apparatus 40 may process the semiconductor substrate according to the instruction received from the instruction generation unit 90.

The instruction generation unit 90 may be implemented by a general purpose computer having a configuration similar to that shown in FIG. 1 for implementing the evaluation device. In some examples, the instruction generation unit 90 may be implemented on the same general purpose computer on which the evaluation device 10 is implemented. In other examples, the instruction generation unit 90 may be implemented a general purpose computer comprised in the semiconductor substrate manufacturing device 40. In yet other examples, the instruction generation may perform the determination of step S30 again and wait until it is determined to start the evaluation.

In step S40 of FIG. 8, the parent AI may perform its operation to evaluate the quality of a substrate in an image captured by the camera 50 as described later in more detail with reference to FIG. 11.

After step S40, in step S50 of FIG. 8, the evaluation device 10 may evaluate the output from the parent AI as described later in more detail with reference to FIG. 12.

After step S50, the evaluation device 10 may determine whether or not to end the evaluation process in step S55. For example, the evaluation device 10 may determine to end the evaluation process when the evaluation device 10 has no more image of a semiconductor substrate to be evaluated and/or the evaluation device 10 receives a signal from the manufacturing apparatus 40 indicating that the manufacturing of the semiconductor substrates have ended. Further, for example, the evaluation device 10 may determine not to end the evaluation process when the evaluation device 10 still has one or more images to be evaluated and/or the evaluation device 10 receives a signal from the manufacturing apparatus 40 indicating that the manufacturing of the semiconductor substrates is still ongoing. When it is determined not to end the evaluation process (NO in step S55), the processing may return to step S40. When it is determined to end the evaluation process (YES in step S55), the processing shown in FIG. 8 may end.

Figure 9:
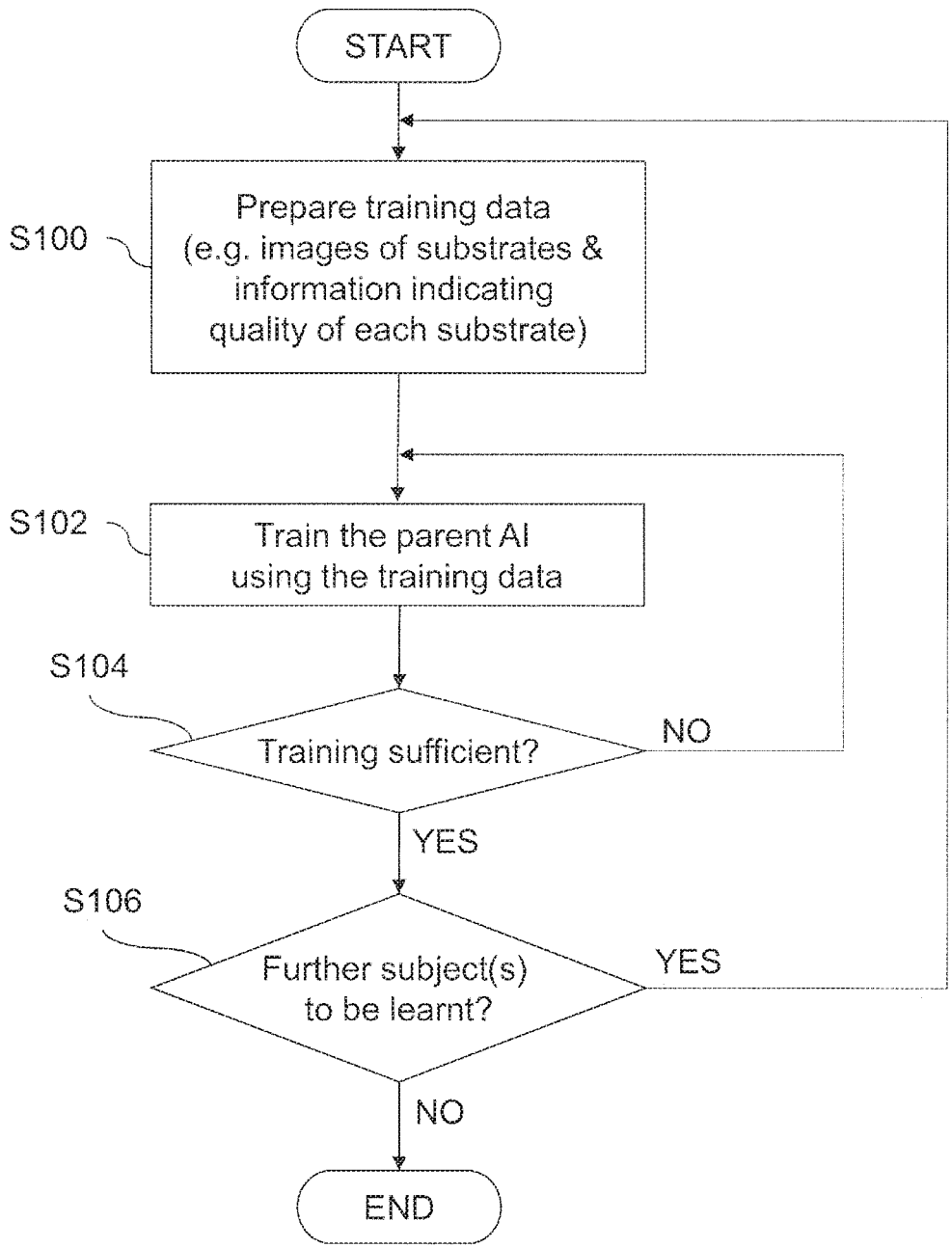
FIG. 9 shows a flowchart of exemplary processing for training a machine learning device (parent AI).

FIG. 9 shows a flowchart of exemplary processing for training the parent AI. FIG. 9 is an example of detailed processing of step S10 of FIG. 8. When step S10 of FIG. 8 is started, the processing shown in FIG. 9 may start.

In step S100 of FIG. 9, training data may be prepared for training the parent AI by training data generation unit 706 of the parent AI. For example, the training data generation unit 706 may receive an image of a semiconductor substrate and information indicating the quality of the semiconductor substrate via the receiving unit 700 of the parent AI and generate an element of the training data set, the element including a combination of the received image and the received quality information. The training data generation unit 706 may generate a specified number of such elements of the training data set.

In step S102 of FIG. 9, the parent AI may be trained using the training data generated in step S100, by the AI training unit 708 of the parent AI. For example, the AI training unit 708 of the parent AI may retrieve data structure of a CNN from the neural network DB 80 and train the CNN as the AI 7020 of the computation unit 702, by adjusting the weights of the convolutional layer(s) and the fully connected layer(s) as described above with reference to FIGS. 4 to 6.

After step S102, the AI training unit 708 may determine whether or not the training is sufficient in step S104 of FIG. 9. In some examples, the AI training unit 708 may use, for the determination of step S104, test data including one or more images of semiconductor substrates and information indicating quality of each of the semiconductor substrates in the images. The test data set may be prepared in a manner analogous to that for preparing the training data set in step S100. In some examples, the AI training unit 708 may use a part of the training data prepared in step S100 for training the parent AI in step S102 and the remaining part of the training data prepared in step S100 as the test data for determining whether the training is sufficient in step S104. In the examples of using the test data in step S104, the AI training unit 708 may input the images in the test data to the AI 7020 of the computation unit 702 and compare the outputs from the AI 7020 for the images with the known quality of the semiconductor substrates in corresponding images. The AI training unit 708 may, for example, determine that the training is sufficient if a ratio of the number of correct outputs from the AI 7020 over the total number of images in the test data exceeds a predetermined threshold. Alternatively, for example, the AI training unit 708 may determine that the training is sufficient if the number of correct outputs from the AI 7020 exceeds a predetermined threshold. When it is determined that the training is not sufficient (NO in step S104), the processing may return to step S102. When it is determined that the training is sufficient (YES in step S104), the processing may proceed to step S106.

In step S106, the AI training unit 708 may determine whether or not there is (are) further subject(s) to be learnt by the parent AI. For example, in case the parent AI is desired to evaluate the quality of more than one kinds of semiconductor substrates and training data relating to at least one of said more than one kinds of semiconductor substrates has not yet been generated in step S100, the AI training unit 708 may determine that there is (are) further subject(s) to be learnt by the parent AI. When it is determined that there is (are) further subject(s) to be learnt (YES in step S106), the processing may return to step S100. Otherwise (NO in step S106), the processing shown in FIG. 9 may end.

Figure 10:
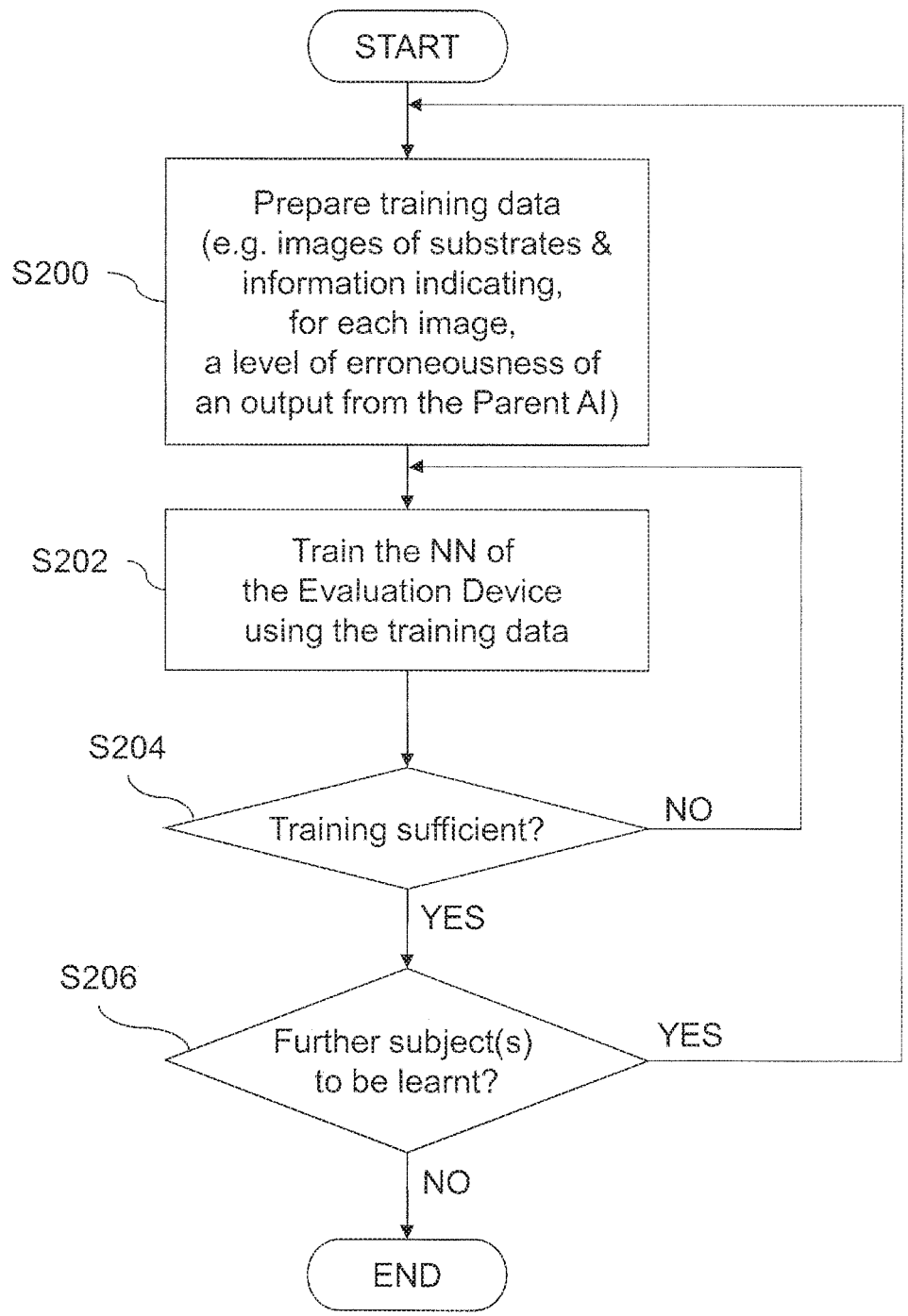
FIG. 10 shows a flowchart of exemplary processing for training a neural network of an evaluation device comprised in the evaluation system.

FIG. 10 shows a flowchart of exemplary processing for training a neural network of an evaluation device 10 comprised in the evaluation system. FIG. 10 is an example of detailed processing of step S20 of FIG. 8. When step S20 of FIG. 8 is started, the processing shown in FIG. 10 may start.

In step S200 of FIG. 10, the neural network training unit 106 of the evaluation device 10 may prepare training data for training the NN 1020 of the evaluation device 10. For example, the training data may include images of semiconductor substrates and information indicating, for each image, a level of erroneousness of an output from the parent AI for said image.

In some examples, the neural network training unit 106 of the evaluation device 10 may prepare the training data in step S200 as follows. First, the neural network training unit 106 may receive images of manufactured semiconductor substrates and quality information indicating, for each one of the received images, quality of a manufactured semiconductor substrate in said one of the received image. It is noted that the received image and the quality information may have the same format as the training data for training the parent AI. Further, the neural network training unit 106 of the evaluation device 10 may provide one of the received images to the parent AI as an input, obtain an output from the parent AI in response to the provision of said one of the received images, and compare the obtained output from the parent AI with the quality of the manufactured semiconductor substrate in the image provided to the parent AI. Based on the comparison, the neural network training unit 106 may generate an element of a training data set, the element including a combination of an image of a semiconductor substrate and information indicating a level of erroneousness of an output from the parent AI for said image. The neural network training unit 106 may generate an element of the training data set for each of the received image.

In step S202, the neural network training unit 106 may train the NN 1020 of the evaluation device 10 using the training data prepared in step S200. For example, the neural network training unit 106 may retrieve a data structure of a CNN from the neural network DB 80 and train the CNN as the NN 1020 in the determination unit 102, by adjusting the weights of the convolutional layer(s) and the fully connected layer(s) as described above with reference to FIGS. 4 to 6. Alternatively, for example, the neural network training unit 106 may retrieve a data structure of a neural network with more than three layers (e.g., as shown in FIG. 7A) and train the neural network using a deep learning technique involving an autoencoder as described above with reference to FIGS. 7A and 7B. In other examples, another type of neural network may be used as the NN 1020. During training of the NN 1020, the information indicating a level of erroneousness of an output from the parent AI for an image may be used as a supervisory signal.

After step 202, the neural network training unit 106 may determine whether or not the training is sufficient. This determination may be made in a manner analogous to that of step S102 of FIG. 9. When it is determined that the training is not sufficient (NO in step S204), the processing may return to step S202. When it is determined that the training is sufficient (YES in step S204), the processing may proceed to step S206.

In step S206, the neural network training unit 106 may determine whether or not there is (are) further subject(s) to be learnt by the NN 1020 of the evaluation device 10. This determination may be made in a manner analogous to that of step S106 of FIG. 9. When it is determined that there is (are) further subject(s) to be learnt (YES in step S206), the processing may return to step S200. Otherwise (NO in step S206), the processing shown in FIG. 10 may end.

According to the processing of FIG. 10, the evaluation device 10 may be able to determine for which kind(s) of input images the parent AI is likely to provide an erroneous (or correct) output.

Figure 11:
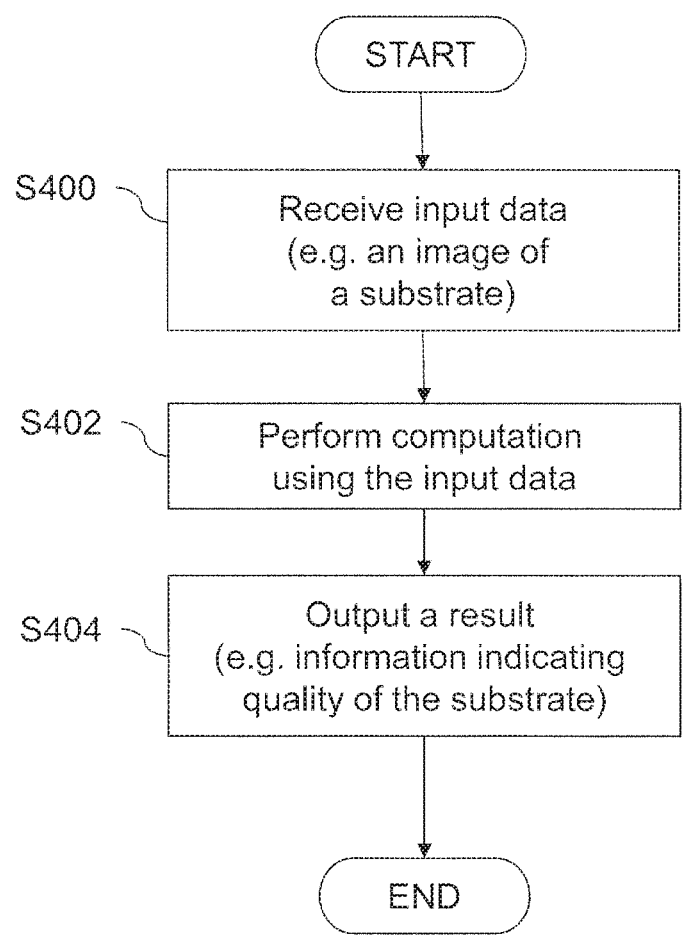
FIG. 11 shows a flowchart of exemplary processing performed by the machine learning device (parent AI).

FIG. 11 shows a flowchart of exemplary processing performed by the parent AI. FIG. 11 is an example of detailed processing of step S40 of FIG. 8. When step S40 of FIG. 8 is started, the processing shown in FIG. 11 may start.

In step S400 of FIG. 11, the parent AI may receive input data, for example, an image of a semiconductor substrate from the camera 50.

After step S400, the parent AI may perform computation using the received input data in step S402. For example, when a CNN is employed as the AI 7020 of the parent AI, the parent AI may perform computation by inputting the received input data to the CNN and obtain an output from the CNN.

After step S402, the parent AI may output a result of the computation, for example, information indicating quality of the semiconductor substrate in step S404.

The processing of FIG. 11 may end after step S404.

Figure 12:
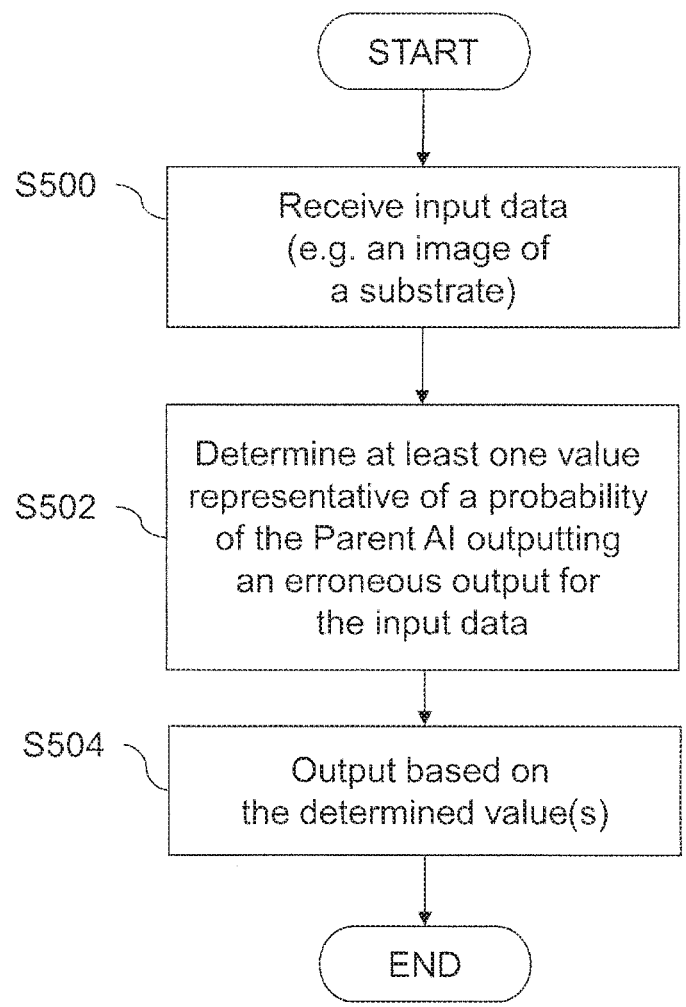
FIG. 12 shows a flowchart of exemplary processing performed by the evaluation device.

FIG. 12 shows a flowchart of exemplary processing performed by the evaluation device. FIG. 12 is an example of detailed processing of step S50 of FIG. 8. When step S50 of FIG. 8 is started, the processing shown in FIG. 12 may start.

In step S500 of FIG. 12, the receiving unit 100 of the evaluation device 10 may receive input data, for example, an image of a semiconductor substrate from the camera 50.

After step S500, the determination unit 104 of the evaluation device 10 may determine, in step S502, at least one value representative of a probability of the parent AI outputting an erroneous output for the input data received in step S500. For example, the determination unit 104 may input the received image into the NN 1020 and obtain an output from the NN 1020. The NN 1020 may be, for example, a CNN as described above with reference to FIGS. 4 to 6. Alternatively, for example, the NN 1020 may be a neural network for deep learning as described above with reference to FIGS. 7A and 7B. Another type of neural network may be used as the NN 1020 in other examples.

After step S502, the processing proceeds to step S504 and the output unit 106 of the evaluation device 10 may output an output based on the at least one value representative of the probability determined in step S502. The processing shown in FIG. 12 may end after step S504.

According to the processing of FIG. 12, information may be provided as to how likely the output of the parent AI is erroneous (or correct) for a particular input, which may contribute to improving overall accuracy of evaluation for a semiconductor substrate.

Figure 13:
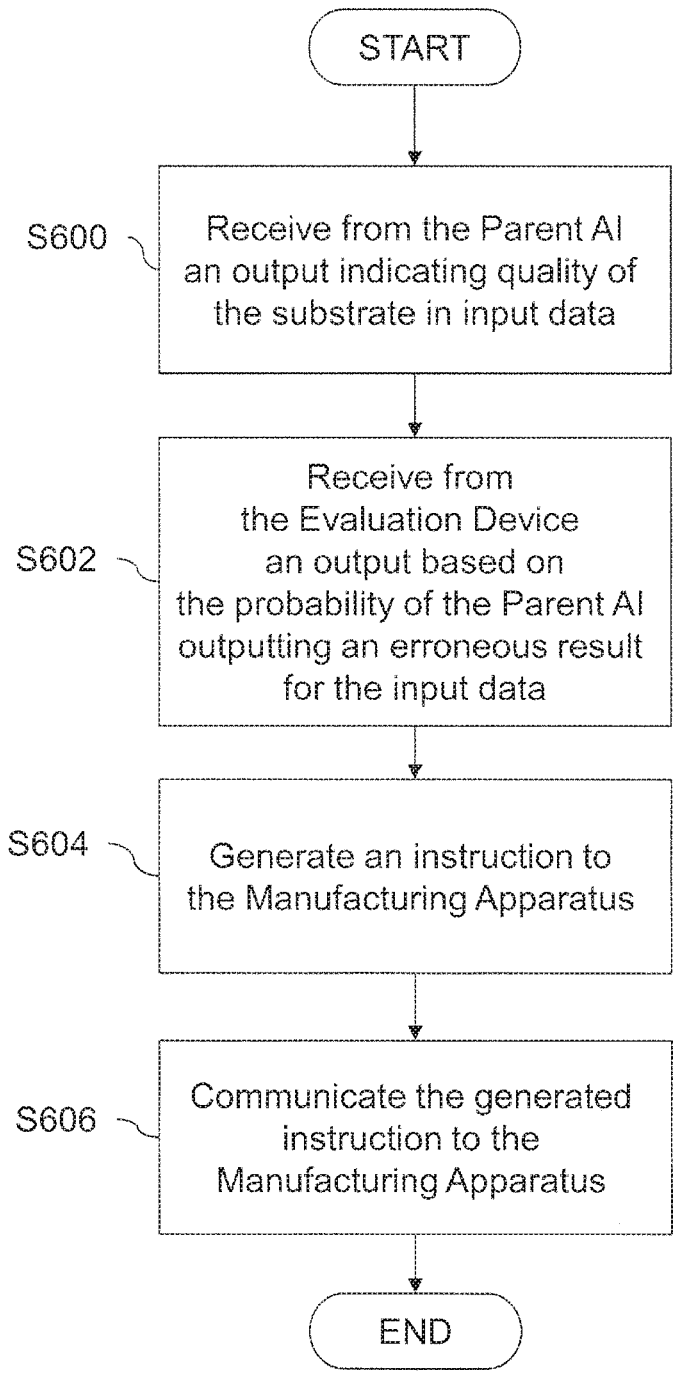
FIG. 13 shows a flowchart of exemplary processing for generating an instruction to a manufacturing apparatus.

FIG. 13 shows a flowchart of exemplary processing for generating an instruction to a semiconductor substrate manufacturing apparatus. The processing shown in FIG. 13 may be started when the instruction generation unit 90 receives the outputs from the parent AI and the output unit 106 of the evaluation device 10.

In step S600 of FIG. 13, the instruction generation unit 90 may receive from the parent AI an output indicating quality of the substrate in an input image.

Further, in step S602, the instruction generation unit 90 may receive from the evaluation device 10 an output based on the probability of the parent AI outputting an erroneous result for the input data.

After step S602, the instruction generation unit 90 may generate an instruction to the manufacturing apparatus 40 in step S604. For example, one of the instructions shown in Table 1 above may be generated depending on the combination of the outputs from the parent AI and the evaluation device received in steps S600 and S602.

After step S604, the instruction generation unit 90 may communicate the generated instruction to the manufacturing apparatus 40 in step S606. The processing shown in FIG. 13 may end after S606.

The manufacturing apparatus 40 may operate according to the instruction communicated from the instruction generation unit 90 in step S606 of FIG. 13. This may contribute to improving the overall quality of the semiconductor substrates manufactured by the manufacturing apparatus 40 since the manufacturing apparatus 40 may process the manufactured semiconductor substrates in consideration of how likely the parent AI may erroneously determine the quality of each of the manufactured semiconductor substrates.

Variations

It should be appreciated by those skilled in the art that the exemplary embodiments and their variations as described above with reference to FIGS. 1 to 13 are merely exemplary and other embodiments and variations may exist.

For example, in the exemplary embodiments and examples described above, both the parent AI and the evaluation device 10 take an image of a semiconductor substrate as an input to the AI 7020 and the NN 1020. However, in some examples, the parent AI and/or the evaluation device 10 may take sensor information from one or more sensors (see e.g., sensors 60 of FIG. 1) as a part of the input in addition to the image. The one or more sensors may be one or more of: a temperature sensor, a humidity sensor, a brightness sensor; an atmospheric pressure sensor. In such a case, the predetermined format of input data for the parent AI may represent data including an image and sensor information.

When the parent AI takes sensor information as a part of the input and in case the parent AI employs a CNN as described above with reference to FIGS. 4 to 6, for example, an additional fully connected layer may be inserted between the last fully connected layer and the output layer of the CNN (see e.g., FIG. 6), where the additional fully connected layer may have more number of nodes than the last fully connected layer. The additional fully connected layer may include, for example, nodes corresponding to the nodes of the last fully connected layer and one or more additional nodes corresponding to the one or more sensors. Each of the one or more additional nodes may correspond to one of the one or more sensors and may accept a value output from the corresponding sensor.

When the evaluation device 10 takes sensor information as a part of input and in case the NN 1020 has a configuration as shown in FIG. 7A, a node corresponding to each of available sensors may be provided in the input layer of the NN 1020, in addition to the nodes corresponding to pixel values in the input image, for example. In case the NN 1020 is a CNN as described above with reference to FIGS. 4 to 6, the sensor information may be incorporated into the CNN in a manner analogous to that in case of the parent AI being a CNN as stated above. By taking sensor information as a part of input, the evaluation device 10 may be able to learn and determine under which environment (e.g. temperature, humidity, brightness, atmospheric pressure etc.) the parent AI could output an erroneous output for which kind of images.

Further, for example, in case only the parent AI uses the sensor information as a part of input and the evaluation device 10 takes only images without sensor information as inputs, the training of and the determination made by the evaluation device 10 can be performed using input data with a smaller size than the input data for the parent AI.

In any case, an input to the evaluation device 10 may include at least a part of an input to the parent AI.

Further, although the exemplary embodiments described above relate to evaluating the quality of a semiconductor substrate, the exemplary embodiments and variations thereof can be applied also for evaluating quality of any other kind of manufactured products. For these applications, images of manufactured products may be used for training the parent AI and the NN 1020 of the evaluation device 10 in a manner analogous to those for the exemplary embodiments as explained above. Then the parent AI may evaluate the quality of the manufactured products for which the parent AI has been trained and the evaluation device 10 may evaluate the outputs of the parent AI in a manner analogous to those for the exemplary embodiments as explained above.

Moreover, the exemplary embodiments described above may be applied not only for evaluating products manufactured by a manufacturing apparatus but also for evaluating other kinds of products such as agricultural products (e.g., fruits and vegetables). For example, the parent AI may be trained to classify an agricultural product into two or more quality classes using an image of the agricultural product, in a manner analogous to those for the exemplary embodiments as explained above. Further, the evaluation device 10 may be trained to determine the probability of the parent AI outputting an erroneous output for a particular image using images of the same kind of agricultural product in a manner analogous to those for the exemplary embodiments as explained above.

Further application of the evaluation method in the exemplary embodiments may include image recognition for medical diagnosis. For example, the parent AI may be trained to perform classification of medical images of at least an external or internal part of a human or animal body, using a known machine learning method (including e.g., CNNs as described above). The evaluation device 10 may be trained to determine for which medical images the parent AI is likely to output erroneous outputs, using the medical images as inputs. In this case, medical images, outputs from the parent AI for the medical images and known diagnosis for each image may be used for training the NN 1020 of the determination unit 102 included in the evaluation device 10. The medical images may include, but may not be limited to, X-Ray images, computer tomography (CT) images, magnetic resonance imaging (MRI) images, ultrasonic images and images captured using an endoscope.

Moreover, the determination performed by the determination unit 102 of the evaluation device 10 in the exemplary embodiments may also be applied in case of the parent AI dealing with a more general image recognition problem. For example, the parent AI may include a CNN (see e.g., FIGS. 4 to 6) trained to detect a particular object (e.g., a human or an animal such as a cat, bird, dog etc.) within an image. In such an example, the NN 1020 of the determination unit 1020 may be trained to evaluate how likely that the parent AI outputs an erroneous detection result for a particular image. For instance, images of different scenes, outputs of the parent AI for these images and information indicating whether or not the target object is present in each image can be used for training the NN 1020 of the determination unit 1020.

In relation to image recognition, for example, the parent AI may be trained to perform object recognition during driving of a vehicle. For instance, images captured during driving of a vehicle by one or more imaging devices (e.g. cameras) provided on the vehicle may be used as input data for the parent AI. The images may represent scenes in front of the vehicle in case the images are captured by a camera provided at the front of the vehicle, for example. Alternatively or additionally, the images may represent scenes at the back of the vehicle in case the images are captured by a camera provided at the rear of the vehicle. The parent AI may be trained to determine whether or not any target object(s) (e.g., a human, an animal, and/or any other object which collision with the vehicle is desired to be avoided) is/are present in the scene represented by an input image. In this example, the parent AI may comprise a CNN as described above with reference to FIGS. 4 to 6 and the CNN may be trained to detect one or more target objects using images captured by one or more imaging devices provided on a vehicle.

In the exemplary application of object recognition during driving of a vehicle, the parent AI may be more likely to provide erroneous results for some scenes where the conditions of the road surface could be different from usual conditions, such as scenes during night, scenes with rain, snow and/or ice, etc. Further, in this example, the determination unit 102 of the evaluation device 10 may be trained to determine how likely the parent AI will output an erroneous result of object recognition for images of which kind of scenes. The NN 1020 of the determination unit 102 may include a CNN (see e.g., FIGS. 4 to 6) and may be trained using images captured by one or more cameras provided on a vehicle, outputs of the parent AI for these images and information indicating whether or not one or more target objects are present in each image. The information indicating whether or not one or more target objects are present in each image may be provided by a user. The outputs of the parent AI and the information indicating whether or not one or more target objects are present in each image may be used for generating supervisory signals for training the NN 1020, indicating, for each image, a level of erroneous ness for an output from the parent AI for that image. The NN 1020 of the determination unit 102 so trained can determine, for example, that the parent AI may be more likely to output an erroneous recognition result for an image of a scene including snow on the road.

Further, in the exemplary application of object recognition during driving of a vehicle, the NN 1020 may further take sensor information, as a part of input, from one or more sensors provided on the vehicle. For example, a temperature sensor provided on the vehicle to detect outside air temperature. In such a case, the NN 1020 may be a CNN (see e.g., FIGS. 4 to 6) that includes an additional fully connected layer having a node corresponding to the sensor information from the temperature sensor, as described above with regards to the use of sensor information in the examples of semiconductor substrate evaluation. The sensor information from the temperature sensor may contribute to improving accuracy of the determination made by the NN 1020 of the determination unit 102 since, for example, an outside air temperature around or below 0° C. may indicate the possible presence of snow and/or ice on the road in which case the parent AI may be more likely to output an erroneous recognition result. Additionally or alternatively to the temperature sensor as stated above, the sensor information may be obtained from one or more of the following sensors provided on the vehicle: rain sensor, yaw rate sensor, inclination sensor, acceleration sensor, daylight sensor, radar sensor, IR (infrared) sensor.

In addition, the applications to the determination performed by the determination unit 102 of the evaluation device 10 of the exemplary embodiments may not be limited to image analysis performed by the parent AI. Further applications may include, but may not be limited to, determination regarding an output from a parent AI that is trained to perform speech recognition or natural language processing, for example.

In case of speech recognition, the parent AI may comprise a CNN (see e.g., FIGS. 4 to 6) trained to recognize particular words in a speech using audio data of utterances as training data, for instance. In the example of speech recognition, the predetermined format of the input data for the parent AI may represent the audio data which is suitable for use as inputs to a CNN. Further, in this example, the NN 1020 of the determination unit 102 included in the evaluation device 10 may be trained to determine at least one value representative of a probability of the parent AI outputting an erroneous output for particular audio data. For instance, audio data of utterances, outputs from the parent AI for the audio data and information indicating whether or not particular words are included in the audio data can be used for training the NN 1020 of the determination unit 102.

In case of natural language processing, the parent AI may comprise a CNN (see e.g., FIGS. 4 to 6) trained to perform classification of texts written in a natural language, for example. In this example, the predetermined format of the input data for the parent AI may represent data of the texts that may be pre-processed to be suitable for use as inputs to a CNN. Further, in this example, the NN 1020 of the determination unit 102 included in the evaluation device 10 may be trained to determine at least one value representative of a probability of the parent AI outputting an erroneous output for a particular text. For instance, data of texts, outputs from the parent AI for the data and information indicating the correct classification result for each text may be used for training the NN 1020.

In yet another example, the parent AI may be trained to perform estimation of a state of a driver of an automobile in a driver monitoring device. In this example, the parent AI may take sensor information from various sensors provided on the automobile as inputs and determine the state of the driver. The determination unit 102 of the evaluation device 10 may determine how likely the parent AI will output an erroneous output regarding the state of the driver for a particular input. In this example, the NN 1020 of the determination unit 102 may be trained using the sensor information, outputs from the parent AI and information indicating the correct state of the driver for each element of the sensor information.

In yet another example, the parent AI may be trained to diagnose vascular disease in a patient body such as in the brain and/or heart. As input data to the parent AI, physiological data such as heartbeat, blood pressure, blood sugar level etc. of a human or animal subject (hereinafter, also referred to merely as a "subject") may be used. In this example and variations thereof described herein, a "human or animal subject" may be understood as a human or an animal subject to the diagnosis. In this example, the parent AI may be trained using physiological data as training data. For example, physiological data of each of a plurality of subjects may be collected and the parent AI may be trained using the collected physiological data as the training data and information indicating whether or not each of the plurality of subjects has vascular disease in the brain and/or heart as supervisory signals.

In this exemplary application to diagnosis of vascular disease, the determination unit 102 of the evaluation device 10 may determine how likely the parent AI will output an erroneous diagnosis for particular physiological data. The NN 1020 of the determination unit 102 may be trained using physiological data of a plurality of subjects, outputs of the parent AI for the physiological data and information indicating whether each of the plurality of subjects has vascular disease in the brain and/or heart. The information may be provided by each of the plurality of subjects himself/herself in case the subjects are human, for example. The outputs of the parent AI and the information indicating whether each of the plurality of subjects has vascular disease in the brain and/or heart may be used for generating supervisory signals for training the NN 1020, indicating, for each of the plurality of subjects, a level of erroneousness for an output from the parent AI for the physiological data of that subject.

Further in this exemplary application to diagnosis of vascular disease, the NN 1020 may take, in addition to the physiological data, an image of a face of a human subject while the physiological data is obtained as a part of input data. The image may be captured by an imaging device while the physiological data is obtained from the human subject. The image may be used for analyzing the facial expression of that human subject, e.g., being angry, smiling, being nervous, being pale, etc. The NN 1020 may comprise a CNN (see e.g., FIGS. 4 to 6) to process the image of the face of the human subject whose physiological data is obtained. In such a case, the CNN may comprise an additional fully connected layer including nodes for the image and one or more nodes corresponding to the physiological data. Since it is known that the physiological data can lead to more accurate diagnosis if obtained while the human subject (e.g. patient) is in an ordinary state, using the image of the facial expression of the human subject as a part of input data to the NN 1020 may contribute to improving accuracy of the determination made by the determination unit 102 of the evaluation device 10. For example, the determination unit 102 with the NN 1020 trained using images of facial expressions in addition to the physiological data may determine that the parent AI may be more likely to provide an erroneous diagnosis in case the image shows an angry facial expression. In this example, the parent AI may also be configured to take an image of a face of the person as a part of input data, in a manner analogous to that with the NN 1020 as stated above.

The exemplary embodiments and variations thereof as described above may involve a CNN (see e.g., FIGS. 4 to 6) as the parent AI. However, in other embodiments and variations, the parent AI may employ any one of known machine learning techniques.

As long as the NN 1020 of the evaluation device 10 is trained using input data having a format corresponding to the format of the input data for the parent AI and using supervisory signals indicating for which input data the parent AI has output an erroneous output, the evaluation device 10 may be able to determine at least one value representative of the probability of the parent AI outputting an erroneous output for a particular input.

Accordingly, in the exemplary embodiments and variations as described herein, the evaluation device 10 may generally be considered as a determination device for determining error of an output from a parent AI which is configured to: (i) receive input data in a predetermined format, (ii) perform computation using the input data, and (iii) provide a result of the computation as the output.

Further, the following items provide some aspects of the present disclosure.

Item 1. A determination device (10) for determining error of an output from a machine learning device (70) that is configured to: (i) receive input data in a predetermined format, (ii) perform computation using the input data, and (iii) provide a result of the computation as the output, the determination device comprising:

a receiving unit (100) configured to receive data having a format corresponding to the predetermined format;

a determination unit (102) configured to determine, using a neural network (1020), at least one value representative of a probability of the machine learning device (70) outputting an erroneous output for input data corresponding to the received data; and an output unit (104) configured to output an output based on the at least one value representative of the probability, wherein the neural network (1020) has been trained using:
training data having the format corresponding to the predetermined format; and
information indicating, for each element of the training data, a level of erroneousness for an output from the machine learning device (70) for input data corresponding to the element of the training data.

Item 2. The determination device (10) according to item 1, wherein the training data used for training the neural network (1020) includes one or more elements that are not included in training data used for training the machine learning device (70).

Item 3. The determination device (10) according to item 1 or 2, further comprising:

a neural network training unit (106) configured to train the neural network (1020) using the training data having the format corresponding to the predetermined format and the information indicating, for each element of the training data, a level of erroneousness for an output of the machine learning device (70) for input data corresponding to the element of the training data, wherein the training of the neural network (1020) may be performed according to deep learning technique, and wherein the neural network training unit (106) may be further configured to generate the information indicating the level of erroneousness used for training the neural network (1020) by:

receiving the training data having the format corresponding to the predetermined format and information indicating, for each element of the training data, a correct output for input data corresponding to the element of the training data;

providing an element of the training data to the machine learning device (70) as an input;

obtaining an output from the machine learning device (70) in response to the provision of the element of the training data; and comparing the obtained output from the machine learning device (70) with the correct output for input data corresponding to the element of the training data.

Item 4. A determination system comprising:
the determination device (10) according to any one of items 1 to 3; and
the machine learning device (70) configured to: (i) receive input data in a predetermined format, (ii) perform computation using the input data, and (iii) provide a result of the computation as the output.

Item 5. A computer-implemented method for training a neural network (1020) to determine at least one value representative of a probability of a machine learning device (70) outputting an erroneous output for input data having a predetermined format, the machine learning device (70) being configured to: (i) receive input data in a predetermined format, (ii) perform computation using the input data, and (iii) provide a result of the computation as the output, the method comprising:

receiving data having a format corresponding to the predetermined format and information indicating, for each element of the received data, a level of erroneousness for an output from the machine learning device for input data corresponding to the element of the received data; and training the neural network (1020) using the received data as inputs to the neural network (1020) and the received information as supervisory data, wherein the training may be according to deep learning technique.

Item 6. A determination device (10) for determining error of an output from a machine learning device (70), the determination device comprising:

a receiving unit (100) configured to receive an image of a scene, the image being captured during driving of a vehicle by an imaging device (50) provided on the vehicle;

a determination unit (102) configured to determine, using a neural network (1020), at least one value representative of a probability of a machine learning device (70) outputting an erroneous output for the image of the scene, the machine learning device (70) being configured to: (i) receive the image of the scene, (ii) perform computation using the received image, and (iii) output information indicating whether or not one or more target objects are present in the scene based on a result of the computation; and an output unit (104) configured to output an output based on the at least one value representative of the probability, wherein the neural network (1020) has been trained using:
images of scenes captured by the imaging device provided on the vehicle; and
information indicating, for each one of the images of the scenes, a level of erroneousness for an output from the machine learning device (70) for said one of the images of the scenes.

Item 7. An object recognition system comprising:
the determination device (10) according to item 6; and
the machine learning device (70) configured to: (i) receive the image of the scene, (ii) perform computation using the received image, and (iii) output information indicating whether or not one or more target objects are present in the scene based on a result of the computation.

Item 8. A computer-implemented method for determining error of an output from a machine learning device (70), the method comprising:

receiving an image of a scene, the image being captured during driving of a vehicle by an imaging device (50) provided on the vehicle;

determining, using a neural network (1020), at least one value representative of a probability of a machine learning device (70) outputting an erroneous output for the image of the scene, the machine learning device (70) being configured to: (i) receive the image of the scene, (ii) perform computation using the received image, and (iii) output information indicating whether or not one or more target objects are present in the scene based on a result of the computation; and outputting an output based on the at least one value representative of the probability, wherein the neural network (1020) has been trained using:
images of scenes captured by the imaging device provided on the vehicle; and
information indicating, for each one of the images of the scenes, a level of erroneousness for an output from the machine learning device (70) for said one of the images of the scenes.

Item 9. A determination device (10) for determining error of an output from a machine learning device (70), the determination device comprising:

a receiving unit (100) configured to receive physiological data of a human or animal subject;

a determination unit (102) configured to determine, using a neural network (1020), at least one value representative of a probability of a machine learning device (70) outputting an erroneous output for the physiological data of the human or animal subject, the machine learning device (70) being configured to: (i) receive the physiological data of the human or animal subject, (ii) perform computation using the received physiological data, and (iii) output information indicating whether or not the human or animal subject has vascular disease in a brain and/or heart based on a result of the computation; and an output unit (104) configured to output an output based on the at least one value representative of the probability, wherein the neural network (1020) has been trained using:
physiological data of human or animal subjects; and
information indicating, for physiological data of each one of the human or animal subjects, a level of erroneousness for an output from the machine learning device (70) for the physiological data of said one of the human or animal subjects.

Item 10. A diagnostic system comprising:
the determination device (10) according to item 9; and
the machine learning device (70) configured to: (i) receive the physiological data of the human or animal subject, (ii) perform computation using the received physiological data, and (iii) output information indicating whether or not the human or animal subject has vascular disease in a brain and/or heart based on a result of the computation.

Item 11. A computer-implemented method for determining error of an output from a machine learning device (70), the method comprising:

receiving physiological data of a human or animal subject;

determining, using a neural network (1020), at least one value representative of a probability of a machine learning device (70) outputting an erroneous output for the physiological data of the human or animal subject, the machine learning device (70) being configured to: (i) receive the physiological data of the human or animal subject, (ii) perform computation using the received physiological data, and (iii) output information indicating whether or not the human or animal subject has vascular disease in a brain and/or heart based on a result of the computation; and outputting an output based on the at least one value representative of the probability, wherein the neural network (1020) has been trained using:
physiological data of human or animal subjects; and
information indicating, for physiological data of each one of the human or animal subjects, a level of erroneousness for an output from the machine learning device (70) for the physiological data of said one of the human or animal subjects.

The invention claimed is:

1. An evaluation device for evaluating quality of a semiconductor substrate manufactured by a semiconductor substrate manufacturing apparatus, the evaluation device comprising a processor configured with a program to perform operations comprising:

operation as a receiving unit configured to receive an image of the semiconductor substrate, the image being captured by an imaging device provided on the semiconductor substrate manufacturing apparatus;

operation as a determination unit configured to determine, using a neural network, at least one value representative of a probability of a machine learning device outputting an erroneous output for the image of the semiconductor substrate, the machine learning device being configured to: receive the image of the semiconductor substrate; perform computation using the received image; and output information indicating the quality of the semiconductor substrate based on a result of the computation; and operation as an output unit configured to output an output based on the at least one value representative of the probability, wherein the neural network is trained using training data comprising images of manufactured semiconductor substrates, and supervisory data obtained by:
inputting, to the machine learning device, the images of manufactured semiconductor substrates, each of the manufactured semiconductor substrates in the images being of a known quality;
obtaining, for each of the input images of the manufactured semiconductor substrates, an output from the machine learning device; and
comparing, for each of the input images of the manufactured semiconductor substrates, the output from the machine learning device and the known quality of the manufactured semiconductor substrate.

2. The evaluation device according to claim 1, wherein the images used for training the neural network comprise one or more images that are not comprised in training data used for training the machine learning device.

3. The evaluation device according to claim 1, wherein the machine learning device is further configured to receive sensor information from one or more sensors provided in relation to the semiconductor substrate manufacturing apparatus and to perform the computation using the sensor information, and wherein the one or more sensors comprise one or more of:
a temperature sensor;
a humidity sensor;
a brightness sensor; and
an atmospheric pressure sensor.

4. The evaluation device according to claim 3, wherein the neural network is further trained using the sensor information, and wherein the determination made by operation as the determination unit is based at least partially on the sensor information.

5. The evaluation device according to claim 1, wherein
the neural network is further trained using sensor information from one or more sensors provided in relation to the semiconductor substrate manufacturing apparatus,
the one or more sensors comprise one or more of:
a temperature sensor;
a humidity sensor;
a brightness sensor; and
an atmospheric pressure sensor, and
the determination made by operation as the determination unit is based at least partially on the sensor information.

6. The evaluation device according to claim 1, wherein the processor is configured with the program to perform operations further comprising:
operation as a neural network training unit configured to train the neural network using the images of the manufactured semiconductor substrates and the obtained supervisory data,
wherein the training of the neural network is performed according to a deep learning technique.

7. An evaluation system comprising:
the evaluation device according to claim 1; and
the machine learning device configured to receive the image of the semiconductor substrate, perform computation using the received image, and output information indicating the quality of the semiconductor substrate based on a result of the computation.

8. The evaluation system according to claim 7, further comprising:
an instruction generation unit configured to generate an instruction for the semiconductor substrate manufacturing apparatus as to processing of the semiconductor substrate based on the output from the evaluation device and the output from the machine learning device for the image of the semiconductor substrate; and
a communication interface configured to communicate the instruction to the semiconductor substrate manufacturing apparatus.

9. A semiconductor substrate manufacturing system comprising:
the evaluation system according to claim 8;
the semiconductor substrate manufacturing apparatus configured to manufacture the semiconductor substrate; and
the imaging device provided on the semiconductor substrate manufacturing apparatus,
wherein the semiconductor substrate manufacturing apparatus is further configured to:
receive the instruction from the communication interface of the evaluation system; and
process the semiconductor substrate according to the received instruction.

10. The evaluation device according to claim 2, wherein the machine learning device is further configured to receive sensor information from one or more sensors provided in relation to the semiconductor substrate manufacturing apparatus and to further perform the computation using the sensor information, and
wherein the one or more sensors comprise one or more of:
a temperature sensor;
a humidity sensor;
a brightness sensor; and
an atmospheric pressure sensor.

11. The evaluation device according to claim 10, wherein the neural network is further trained using the sensor information, and
the determination made by operation as the determination unit is based at least partially on the sensor information.

12. The evaluation device according to claim 2, wherein the neural network is further trained using sensor information from one or more sensors provided in relation to the semiconductor substrate manufacturing apparatus,
the one or more sensors comprise one or more of:
a temperature sensor;
a humidity sensor;
a brightness sensor; and
an atmospheric pressure sensor, and
the determination made by operation as the determination unit is based at least partially on the sensor information.

13. The evaluation device according to claim 2, wherein the processor is configured with the program to perform operations further comprising:
operation as a neural network training unit configured to train the neural network using the images of the manufactured semiconductor substrates and the obtained supervisory data, wherein
the training of the neural network is performed according to deep learning technique.

14. An evaluation method for evaluating quality of a semiconductor substrate manufactured by a semiconductor substrate manufacturing apparatus, the method comprising:
receiving, by a processor, an image of the semiconductor substrate, the image being captured by an imaging device provided on the semiconductor substrate manufacturing apparatus;
determining, by the processor, using a neural network, at least one value representative of a probability of a machine learning device outputting an erroneous output for the image of the semiconductor substrate, the machine learning device being configured to: receive the image of the semiconductor substrate; perform computation using the received image; and output information indicating the quality of the semiconductor substrate based on a result of the computation; and
outputting, by the processor, an output based on the at least one value representative of the probability,
wherein the neural network is trained using training data comprising images of manufactured semiconductor substrates, and supervisory data obtained by:
inputting, to the machine learning device, the images of manufactured semiconductor substrates, each of the manufactured semiconductor substrates in the images being of a known quality;
obtaining, for each of the input images of the manufactured semiconductor substrates, an output from the machine learning device; and
comparing, for each of the input images of the manufactured semiconductor substrates, the output from the machine learning device and the known quality of the manufactured semiconductor substrate.

15. A non-transitory computer-readable storage medium storing a computer program comprising computer-readable instructions that, when executed by a computer, cause the computer to perform the method according to claim 14.

16. A method for training a neural network to determine at least one value representative of a probability of a machine learning device outputting an erroneous output for an image of a semiconductor substrate, the machine learning device being configured to: receive the image of the semiconductor substrate perform computation using the received image; and output information indicating quality of the semiconductor substrate based on a result of the computation, the method comprising:

receiving images of manufactured semiconductor substrates, each of the manufactured semiconductor substrates in the images being of a known quality inputting the images of the manufactured semiconductor substrates to the machine learning device;

obtaining, for each of the input images of the manufactured semiconductor substrates, an output from the machine learning device;

comparing, for each of the input images of the manufactured semiconductor substrates, the output from the machine learning device and the known quality of the manufactured semiconductor substrate; and training the neural network using the received images as inputs to the neural network and results of the comparison as supervisory data, wherein the training is according to a deep learning technique.

* * * * *